United States Patent
Lee et al.

(10) Patent No.: US 8,243,058 B2
(45) Date of Patent: Aug. 14, 2012

(54) GATE DRIVING CIRCUIT AND DISPLAY DEVICE HAVING THE GATE DRIVING CIRCUIT

(75) Inventors: Jae-Hoon Lee, Seoul (KR); Jun-Yong Song, Busan (KR); Hoi-Sik Moon, Cheonan-si (KR); Yong-Soon Lee, Cheonan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 324 days.

(21) Appl. No.: 12/616,604

(22) Filed: Nov. 11, 2009

(65) Prior Publication Data

US 2010/0207928 A1  Aug. 19, 2010

(51) Int. Cl.
*G06F 3/038* (2006.01)
(52) U.S. Cl. .................. 345/213; 345/211; 345/210
(58) Field of Classification Search .................. None
See application file for complete search history.

(56) References Cited

U.S. PATENT DOCUMENTS

2008/0048712 A1* 2/2008 Ahn et al. .................. 326/21

FOREIGN PATENT DOCUMENTS

| JP | 2007-207413 | 8/2007 |
|---|---|---|
| KR | 1020050037657 | 4/2005 |
| KR | 1020080000205 | 1/2008 |

OTHER PUBLICATIONS

English Abstract for Publication No. 1020050037657.
English Abstract for Publication No. 2007-207413.
English Abstract for Publication No. 1020080000205.

* cited by examiner

*Primary Examiner* — Muhammad N Edun
(74) *Attorney, Agent, or Firm* — F. Chau & Associates, LLC

(57) ABSTRACT

A gate driving circuit includes a plurality of stages connected to each other. An m-th stage ('m' is a natural number) of the stages includes a pull-up part, a pull-down part, a first holding part and a second holding part. The pull-up part outputs a high voltage of a clock signal as a high voltage of an m-th gate signal in response to a high voltage applied to a first output control part. The pull-down part pulls down the high voltage of the m-th gate signal to a first low voltage in response to a high voltage of an (m+1)-th gate signal. The first holding part holds a voltage applied to the first output control part as a second low voltage having a level lower than the first low voltage. The second holding part holds a low voltage of the m-th gate signal to the first low voltage.

20 Claims, 13 Drawing Sheets

GATE DRIVING CIRCUIT AND DISPLAY DEVICE HAVING THE GATE DRIVING CIRCUIT

PRIORITY STATEMENT

This application claims priority under 35 U.S.C. §119 from Korean Patent Application No. 2009-13666, filed on Feb. 19, 2009 in the Korean Intellectual Property Office (KIPO), the contents of which are herein incorporated by reference in their entirety.

BACKGROUND OF THE INVENTION

1. Field of the Invention

Exemplary embodiments of the invention are directed to a gate driving circuit and a display device having the gate driving circuit. More particularly, exemplary embodiments of the invention are directed to a gate driving circuit capable of improving the driving reliability for long periods of time and a display device having the gate driving circuit.

2. Description of the Related Art

To reduce manufacturing costs and the total size of a panel module for a display device, amorphous silicon gate (ASG) technology has been developed, in which a gate driving circuit is formed in a peripheral area of a panel and a switching device is disposed in a display area of a panel at the same time.

ASG technology includes selectively outputting a clock signal in which a phase continuously changes to generate a gate signal, resulting in noise that may be generated by the clock signal even when a gate driving part is not being driven. Accordingly, to minimize the noise generated by the clock signal in a non-driven period, a structure has been proposed that includes various maintenance parts.

However, the ASG structure proposed thus far has not effectively controlled the noise generated by a high gate driving part temperature resulting from long driving periods. Since the noise of the gate signal reduces display quality, the noise should be decreased or prevented.

SUMMARY OF THE INVENTION

Exemplary embodiments of the present invention provide a gate driving circuit capable of improving the reliability of driving for a long time.

Exemplary embodiments of the present invention also provide a display device having the above-mentioned gate driving circuit.

According to one aspect of the present invention, a gate driving circuit including a plurality of stages cascade-connected to each other. The plurality of stages outputs a plurality of gate signals. An m-th stage of the stages includes a pull-up part, a pull-down part, a first holding part and a second holding part. The pull-up part outputs a high voltage of a clock signal as a high voltage of an m-th gate signal in response to a high voltage received from a first output control part. The pull-down part pulls down the high voltage of the m-th gate signal to a first low voltage in response to a high voltage of an (m+1)-th gate signal. The first holding part holds a voltage received from the first output control part as a second low voltage having a level lower than the first low voltage in response to the high voltage of the clock signal. The second holding part holds a low voltage of the m-th gate signal to the first low voltage in response to the high voltage of the clock signal.

According to another aspect of the present invention, a display device includes a display panel, a source driving circuit and a gate driving circuit. The display panel includes a display area, in which gate lines and source lines are formed, displaying an image and a peripheral area surrounding the display area. The source driving circuit outputs data signals to the source lines. The gate driving circuit is integrated in the peripheral area and includes a plurality of stages outputting gate signals to the gate lines. An m-th stage ('m' is a natural number) of the plurality of stages includes a pull-up part, a pull-down part, a first holding part and a second holding part. The pull-up part outputs a high voltage of a clock signal as a high voltage of an m-th gate signal in response to a high voltage received from a first output control part. The pull-down part pulls down the high voltage of the m-th gate signal to a first low voltage in response to a high voltage of an (m+1)-th gate signal. The first holding part holds a voltage received from the first output control part as a second low voltage having a level lower than the first low voltage in response to the high voltage of the clock signal. The second holding part holds the low voltage of the m-th gate signal to the first low voltage in response to the high voltage of the clock signal.

According to an embodiment of the present invention, a negative voltage is applied between a control part and an input part of a pull-up part. The magnitude of a leakage current of the pull-up part decreases so that gate driving circuit noise may be prevented at high temperatures. In addition, the discharging part is controlled by using a carry signal of a next stage to prevent damage to the discharging part due to long driving durations. In addition, a compensation charging part is used to increase a discharge time of the first output control part (Q node), to improve a temporary bump caused by coupling with a gate signal of the next stage.

DETAILED DESCRIPTION OF THE INVENTION

Figure 1:
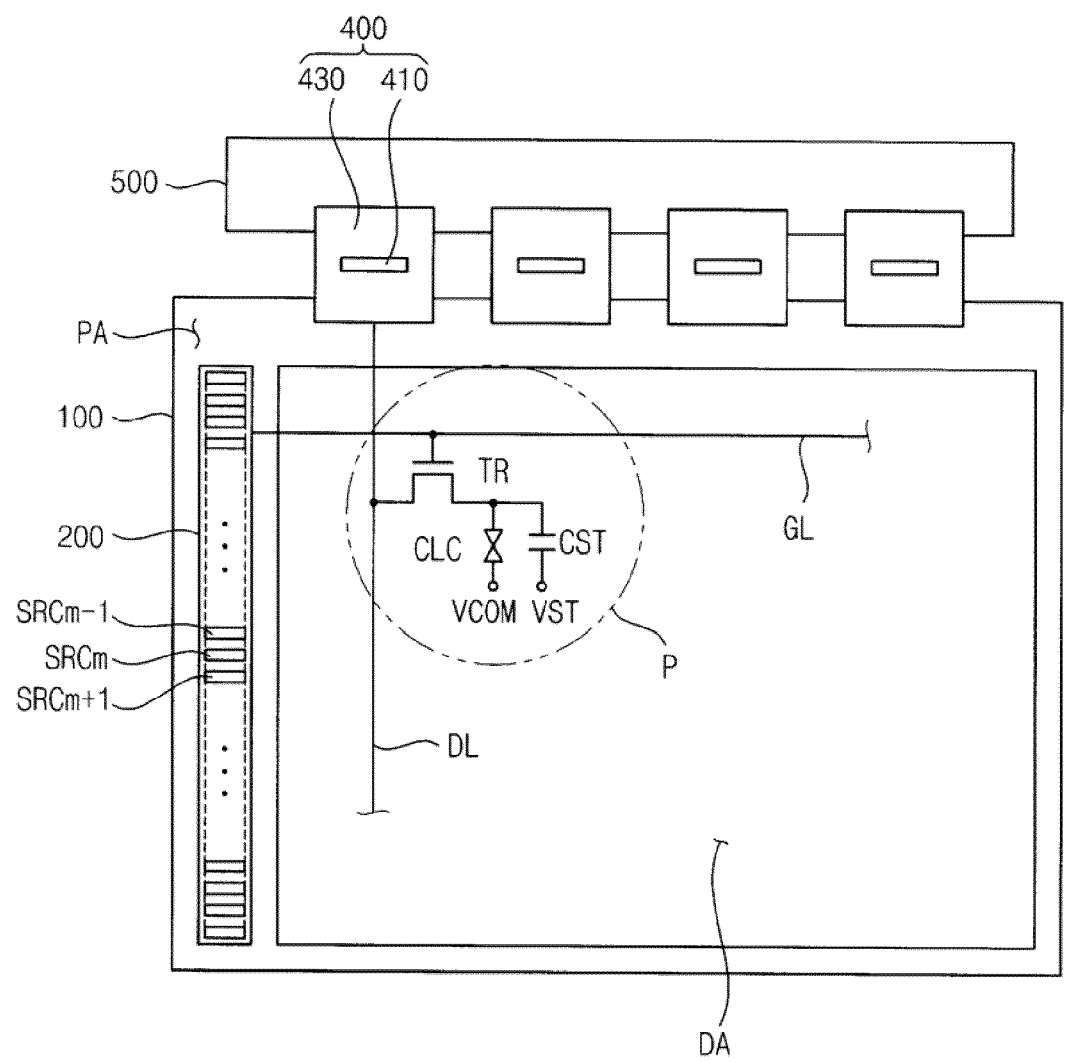
FIG. 1 is a plan view illustrating a display device according to an exemplary embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout.

FIG. 1 is a plan view illustrating a display device according to an exemplary embodiment of the present invention.

Referring to FIG. 1, the display device includes a display panel 100, a gate driving circuit 200, a source driving circuit 400 and a printed circuit board (PCB) 500.

The display panel 100 includes a display area DA and a peripheral area PA surrounding the display area DA. The display area DA includes a plurality of gate lines GL, a plurality of source lines DL, also known as data lines, and a plurality of pixel parts P. Each pixel part P includes a transistor TR electrically connected to the gate lines GL and the source lines DL, a liquid crystal capacitor CLC electrically connected to the transistor TR and a storage capacitor CST connected in parallel to the liquid crystal capacitor CLC. A common voltage VCOM is applied to a common electrode of the liquid crystal capacitor CLC, and a storage common voltage VST is applied to a common electrode of the storage capacitor CST.

The gate driving circuit 200 includes a shift register sequentially outputting gate signals of a high level to the gate lines GL. The shift register includes a plurality of stages, such as SRCm−1, SRCm, SRCm+1 (where 'm' is a natural number). The gate driving circuit 200 is preferably integrated in the peripheral area PA corresponding to one end of the gate lines GL.

The source driving circuit 400 includes a source driving chip 410 outputting data signals to the source lines DL and a flexible printed circuit board (FPCB) 430, on which the source driving chip 410 is mounted, electrically connecting the display panel 100 with the PCB 500. Here, FIG. 1 is illustrated as an example in which the source driving chip 410 is mounted on the FPCB 430. Alternatively, the source driving chip 410 may be directly mounted on the display panel 100, or the source driving chip 410 may be directly integrated in the peripheral area PA of the display panel 100.

Figure 2:
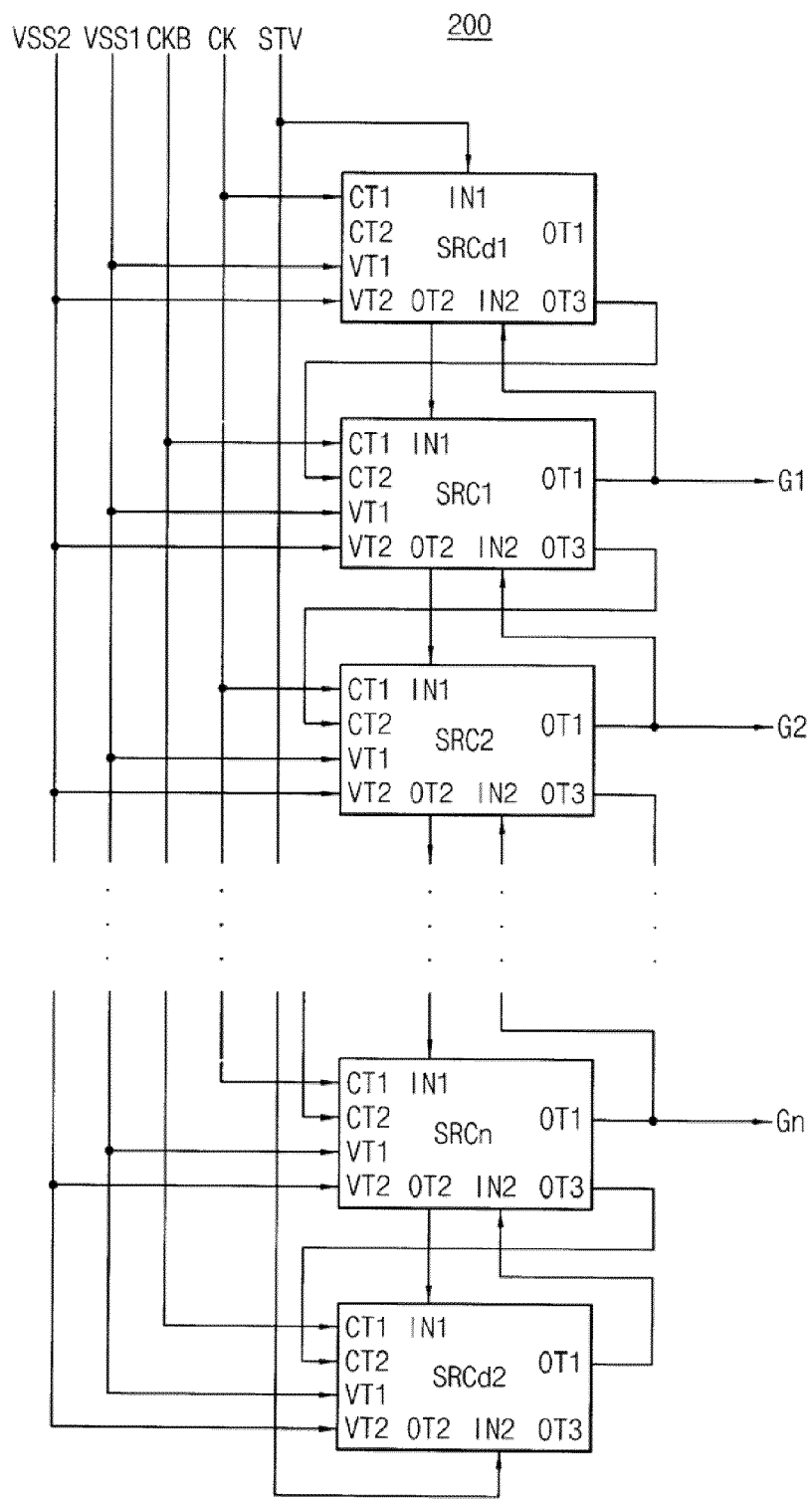
FIG. 2 is a block diagram illustrating the gate driving circuit of FIG. 1.

FIG. 2 is a block diagram illustrating a gate driving circuit of FIG. 1.

Referring to FIG. 2, the gate driving circuit 200 includes a shift register including a first stage SRC1 to an n-th stage SRCn dependently connected to each other, a first dummy stage SRCd1 and a second dummy stage SRCd2.

The first stage SRC1 to the n-th stage SRCn are connected to n gate lines GL1, GL2, GL3, ..., and GLn, respectively, to sequentially output n gate signals to the gate lines GL1, GL2, GL3, ..., and GLn. The first dummy stage SRCd1 controls the driving of the first stage SRC1, and the second dummy stage SRCd2 controls the driving of the n-th stage SRCn. The first dummy stage SRCd1 and the second dummy stage SRCd2 are not connected to the gate lines.

Each stage includes a first clock terminal CT1, a second clock terminal CT2, a first input terminal IN1, a second input terminal IN2, a first voltage terminal VT1, a second voltage terminal VT2, a first output terminal OT1, a second output terminal OT2 and a third output terminal OT3.

The first clock terminal CT1 receives a first clock signal CK or a second clock signal CKB having a phase opposite to the phase of the first clock signal CK. For example, the first clock terminal CT1 of odd-numbered stages SRCd1, SRC2, SRC4, ..., and SRCn receives the first clock signal CK, and the first clock terminal CT1 of even-numbered stages SRC1, SRC3, ..., and SRCd2 receives the second clock signal CKB. Each of the first and second clock signals CK and CKB has a high voltage VDD and a first low voltage VSS1.

The second clock terminal CT2 receives an N node signal from the third output control part of a previous stage. The N node signal is synchronized with the first or second clock signal CK or CKB and has a high voltage lower than the high voltage VDD of the first or second clock signal CK or CKB. For example, the second clock terminal CT2 of the odd stages SRC2, SRC4, ..., and SRCn receives the N node signal synchronized with the second clock signal CKB and the second clock terminal CT2 of the even stages SRC1, SRC3, ..., and SRCd2 receives the N node signal synchronized with the clock signal CK. The second clock terminal CT2 of the first dummy stage SRCd1 may be electrically floated.

The first input terminal IN1 receives a vertical start signal STV or a carry signal of the previous stage. For example, the first input terminal IN1 of the first dummy stage SRCd1 that is a first stage, receives the vertical start signal STV and the first input terminal IN1 of remaining stages SRC1, SRC2, ..., and SRCn, SRCd2 excluding the first dummy stage SRCd1 receives the carry signal of the previous stage.

The second input terminal IN2 receives an output signal of a next stage, which is a gate signal, or a vertical start signal STV. The second input terminal IN2 of each of the first dummy stage SRCd1 to n-th stage SRCn receives an output signal of the next stage and the second input terminal IN2 of the second dummy stage SRCd2 receives the vertical start signal STV. The vertical start signal STV received by the second input terminal IN2 of the second dummy stage SRCd2 may be a vertical start signal corresponding to a the next frame.

The first voltage terminal VT1 receives the first low voltage VSS1. The first low voltage VSS1 has a first low level and the first low level is about −7 V. The first low level corresponds to a discharging level of the gate signal.

The second voltage terminal VT2 receives a second low voltage VSS2 lower than the first low voltage VSS1. The second low level is about −12 V and corresponds to a discharging level of a Q node signal applied to the second output control part.

The first output terminal OT1 is electrically connected to a corresponded gate line and outputs a gate signal to the corresponded gate line. The first output terminal OT1 is electrically connected to the second input terminal IN2 of the previous stage. The first output terminal OT1 of the first dummy stage SRCd1 may be electrically floated.

The second output terminal OT2 outputs the carry signal. The second output terminal OT2 is electrically connected to the first input terminal IN1 of the next stage. The second output terminal OT2 of the second dummy stage SRCd2 may be electrically floated.

The third output terminal OT3 outputs the N node signal applied to the second output control part. The third output terminal OT3 is electrically connected to the first clock terminal CT2 of the next stage.

Figure 3:
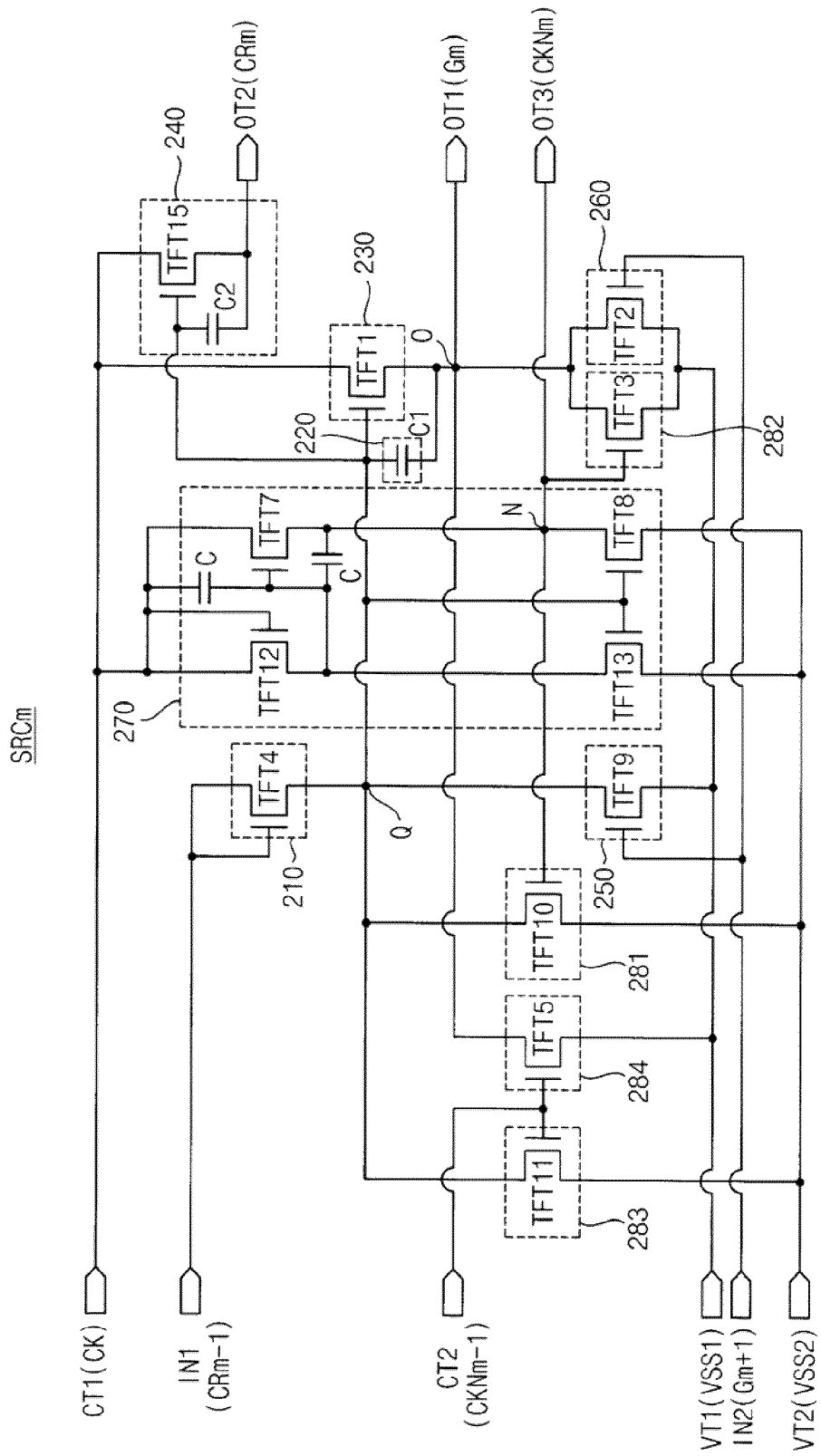
FIG. 3 is a circuit diagram illustrating a stage of FIG. 2.
Figure 4:
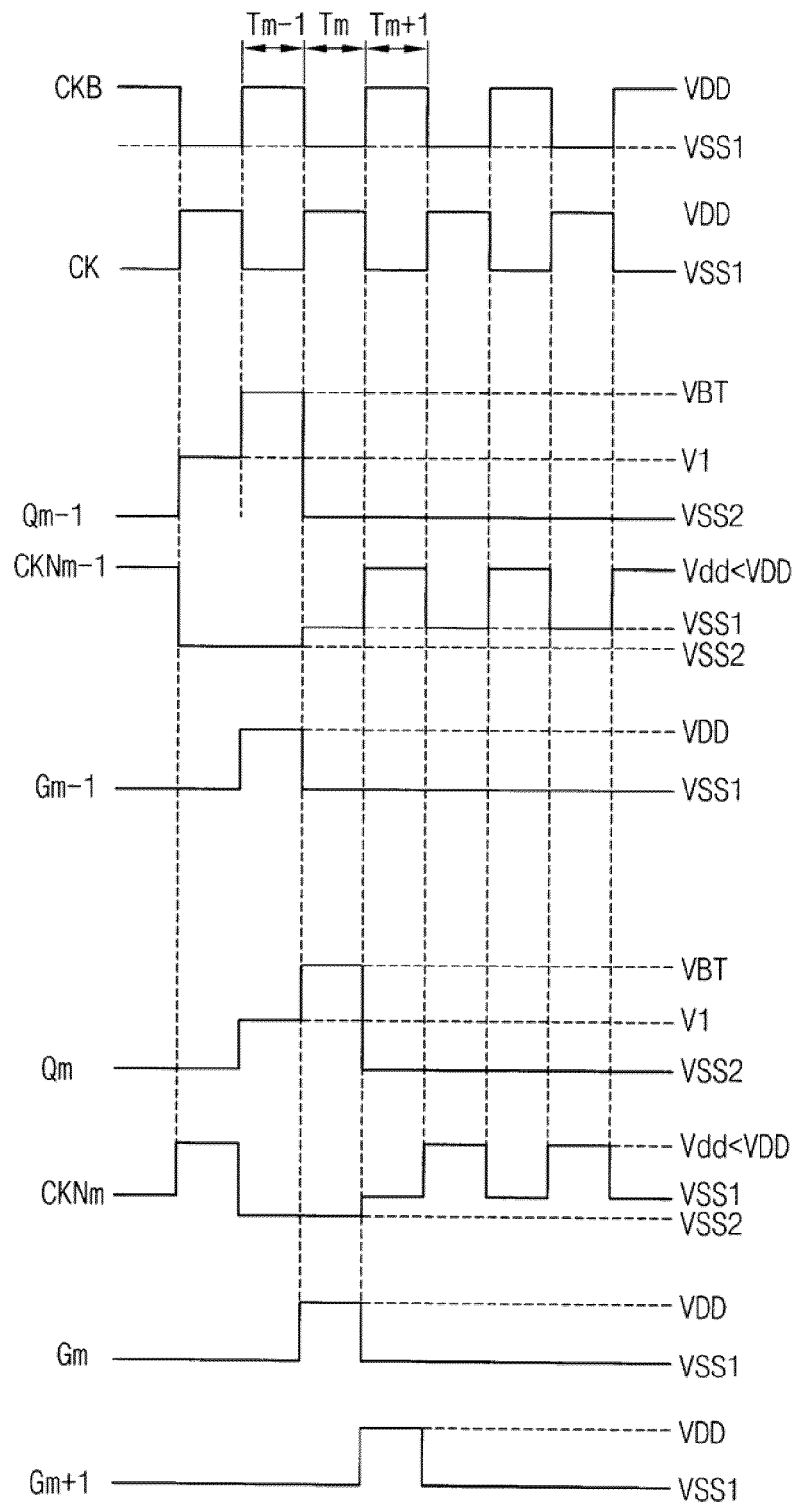
FIG. 4 is a waveform diagram illustrating input/output signals of the gate driving circuit of FIG. 3.

FIG. 3 is a circuit diagram illustrating a stage of FIG. 2. FIG. 4 is a waveform diagram illustrating input/output signals of the gate driving circuit of FIG. 3.

Referring to FIGS. 3 and 4, an m-th stage SRCm includes a buffer part 210, a charging part 220, a pull-up part 230, a carry part 240, a discharging part 250, a pull-down part 260, a switching part 270, a first holding part 281, a second holding part 282, a third holding part 283 and a fourth holding part 284.

The buffer part 210 includes a fourth thin-film transistor (TFT) TFT4. A control part and an input part of the buffer part 210, such as a gate electrode and a source electrode of the fourth TFT TFT4, are connected to the first input terminal IN1, and an output part of the buffer part 210, such as a drain electrode of the fourth TFT TFT4, is connected to the first output control part (Q node). The first output control part (Q node) is connected to a first part of the charging part 220. When a high voltage VDD of the (m−1)-th carry signal CRm−1, an output signal of the previous stage (e.g., an (m−1)-th stage), is received by the first input terminal IN1, the buffer part 210 outputs a first voltage V1 corresponding to the high voltage VDD. The charging part 220 charges the capacitor C1 to the first voltage V1 corresponding to the high voltage VDD.

The pull-up part 230 includes a first TFT TFT1. A control part of the pull-up part 230, such as a gate electrode of the first TFT TFT1, is connected to the first output control part (Q node). An input part of the pull-up part 230, such as a source electrode of the first TFT TFT1, is connected to the first clock terminal CT1. An output part of the pull-up part 230, such as a drain electrode of the first TFT TFT1, is connected to a third output control part (O node). The control part of the pull-up part 230 is connected to the first part of the charging part 220 and the third output control part (O node) is connected to the first output terminal OT1. The charging part 220 includes a capacitor C1 comprising a first electrode connected to the first output control part (Q node) and a second electrode connected to the third output control part (O node).

In a state in which a first voltage V1 of the charging part 220 is applied to the control part of the pull-up part 230, when a high voltage VDD of the first clock signal CK is received by the first clock terminal CT1, the pull-up part 230 is bootstrapped. In this case, the first voltage V1 applied to the first output control part (Q node) connected to the control part of the pull-up part 230 is raised to a boosting voltage VBT. Thus, the first output control part (Q node) has the first voltage V1 during the (m−1)-th period Tm−1 and the boosting voltage VBT at the m-th period Tm.

In the m-th period Tm, in which the boosting voltage VBT is applied to the control part of the pull-up part 230, the pull-up part 230 outputs as the high voltage of the m-th gate signal Gm the high voltage VDD of the first clock signal CK received by the first clock terminal CT1.

The carry part 240 includes a fifteenth TFT TFT15, and a control part of the carry part 240, such as a gate electrode of the fifteenth TFT TFT15, is connected to the first output control part (Q node). An input part of the carry part 240, such as a source electrode of the fifteenth TFT TFT15, is connected to the first clock terminal CT1, and an output part of the carry part 240, such as a drain electrode of the fifteenth TFT TFT15, is connected to the second output terminal OT2. The carry part 240 further includes a capacitor C2 connected to the control part and the output part of the carry part 240. When a high voltage is applied to the first output control part (Q node), the carry part 240 outputs as the high voltage of the m-th carry signal CRm the high voltage VDD of the first clock signal CK received by the first clock terminal CT1.

The discharging part 250 includes a ninth TFT TFT9 and a control part of the discharging part 250, such as a gate electrode of the ninth TFT TFT9, is connected to the second input terminal IN2. An input part of the discharging part 250, such as a source electrode of the ninth TFT TFT9, is connected to the first output control part (Q node), and an output part of the discharging part 250, such as a drain electrode of the ninth TFT TFT9, is connected to the first voltage terminal VT1. When the (m+1)-th gate signal Gm+1 is received by the second input terminal IN2, the discharging part 250 discharges the first low voltage VSS1 received from the first output control part (Q node) to the first voltage terminal VT1.

The pull-down part 260 includes a second TFT TFT2, and a control part of the pull-down part 260, such as a gate electrode of the second TFT TFT2, is connected to the second input terminal IN2. An input part of the pull-down part 260, such as a source electrode of the second TFT TFT2, is connected to the third output control part (O node), and an output part of the pull-down part 260, such as a drain electrode of the second TFT TFT2, is connected to the first voltage terminal VT1. When the (m+1)-th gate signal Gm+1 is received by second input terminal IN2, the pull-down part 260 discharges the first low voltage VSS1 received from the third output control part (O node) to the first voltage terminal VT1.

The switching part 270 includes a twelfth TFT TFT12, a seventh TFT TFT7, a thirteenth TFT TFT13 and an eighth TFT TFT8. A control part and an input part of the twelfth TFT TFT12, such as a gate electrode and a source electrode, are connected to the first clock terminal CT1. An output part of the twelfth TFT TFT12, such as a drain electrode, is connected to an input part of the thirteenth TFT TFT13, such as a source electrode, and a control part of the seventh TFT TFT7, such as a gate electrode. An input part of the seventh TFT TFT7, such as a source electrode, is connected to the first clock terminal CT1 and an output part of the seventh TFT TFT7, such as a drain electrode, is connected to the input part of the eighth TFT TFT8, such as a gate electrode. An output part of the seventh TFT TFT7, such as a drain electrode, is connected to the second output control part (N node).

A control part of the thirteenth TFT TFT13, such as a gate electrode, is connected to the first output control part (Q node). An input part of the thirteenth TFT TFT13, such as a source electrode, is connected to the output part of the twelfth TFT TFT12 and an output part of the thirteenth TFT TFT13, such as a drain electrode, is connected to the second voltage terminal VT2. A control part of the eighth TFT TFT8, such as a gate electrode, is connected to the first output control part (Q node). An input part of the eighth TFT TFT8, such as a source electrode, is connected to the second output control part (N node) and an output part of the eighth TFT TFT8, such as a drain electrode, is connected to the second voltage terminal VT2.

In the (m−1)-th and the m-th period Tm−1 and Tm, in which a high voltage is applied to the first output control part (Q node), the switching part 270 discharges a voltage received from the second output control part (N node) to the second low voltage VSS2. The eighth TFT TFT8 and the thirteenth TFT TFT13 are turned on in response to the high voltage applied to the first output control part (Q node) so that the second output control part (N node) is discharged to the second low voltage VSS2.

In a period of the frame excluding the m-th period, in which a low voltage is applied to the first output control part (Q node), the switching part 270 applies to the second output control part (N node) an m-th N node signal CKNm having substantially the same phase as the first clock signal CK received by the first clock terminal CT1. When the low voltage is applied to the first output control part (Q node), the eighth TFT TFT8 and the thirteenth TFT TFT13 are turned off. Thus, the m-th N node signal CKNm having a high voltage Vdd lower than the high voltage VDD of the first clock signal CK is applied to the second output control part (N node). The high voltage Vdd of the m-th N node signal CKNm is substantially the same as high voltage VDD of the first clock signal CK dropped by the seventh TFT TFT7 and the twelfth TFT TFT12 and a parasitic capacitor C.

The first holding part 281 includes a tenth TFT TFT10, and a control part of the first holding part 281, such as a gate electrode of the tenth TFT TFT10, is connected to the second output control part (N node). An input part of the first holding part 281, such as a source electrode of the tenth TFT TFT10, is connected to the first output control part (Q node), and an output part of the first holding part 281, such as a drain electrode of the tenth TFT TFT10, is connected to the second voltage terminal VT2. The first holding part 281 holds a voltage received from the first output control part (Q node) as the second low voltage VSS2 in response to the high voltage Vdd of the m-th N node signal CKNm during a period except for the m-th period Tm of the frame. The m-th N node signal CKNm has substantially the same phase as the first clock signal CK.

The second holding part 282 includes a third TFT TFT3, and a control part of the second holding part 282, such as a gate electrode of the third TFT TFT3, is connected to the second output control part (N node). An input part of the second holding part 282, such as a source electrode of the third TFT TFT3, is connected to the third output control part (O node) and an output part of the second holding part 282, such as a drain electrode of the third TFT TFT3, is connected to the first voltage terminal VT1. The second holding part 282 holds a voltage received from the third output control part (O node) as the first low voltage VSS1 in response to the high voltage Vdd of the m-th N node signal CKNm during a period except for the m-th period Tm of the frame.

The third holding part 283 includes an eleventh TFT TFT11, and a control part of the third holding part 283, such as a gate electrode of the eleventh TFT TFT11, is connected to the second clock terminal CT2. An input part of the third holding part 283, such as a source electrode of the eleventh TFT TFT11, is connected to the first output control part (Q node) and an output part of the third holding part 283, such as a drain electrode of the eleventh TFT TFT11, is connected to the second voltage terminal VT2. The third holding part 283 holds a voltage received from the first output control part (Q node) as the second low voltage VSS2 in response to the high voltage Vdd of the (m−1)-th N node signal CKNm−1 during a period except for the m-th period Tm of the frame. The (m−1)-th N node signal CKNm−1 has substantially the same phase as the second clock signal CKB having a phase opposite to the first clock signal CK.

The fourth holding part 284 includes a fifth TFT TFT5, and a control part of the fourth holding part 284, such as a gate electrode of the fifth TFT TFT5, is connected to the second clock terminal CT2. An input part of the fourth holding part 284, such as a source electrode of the fifth TFT TFT5, is connected to the third output control part (0 node), and an output part of the fourth holding part 284, such as a drain electrode of the fifth TFT TFT5, is connected to the first voltage terminal VT1. The fourth holding part 284 holds a voltage received from the third output control part (O node) as the first low voltage VSS1 in response to the high voltage Vdd of the (m−1)-th N node signal CKNm−1 during a period except for the m-th period Tm of the frame.

Figure 5:
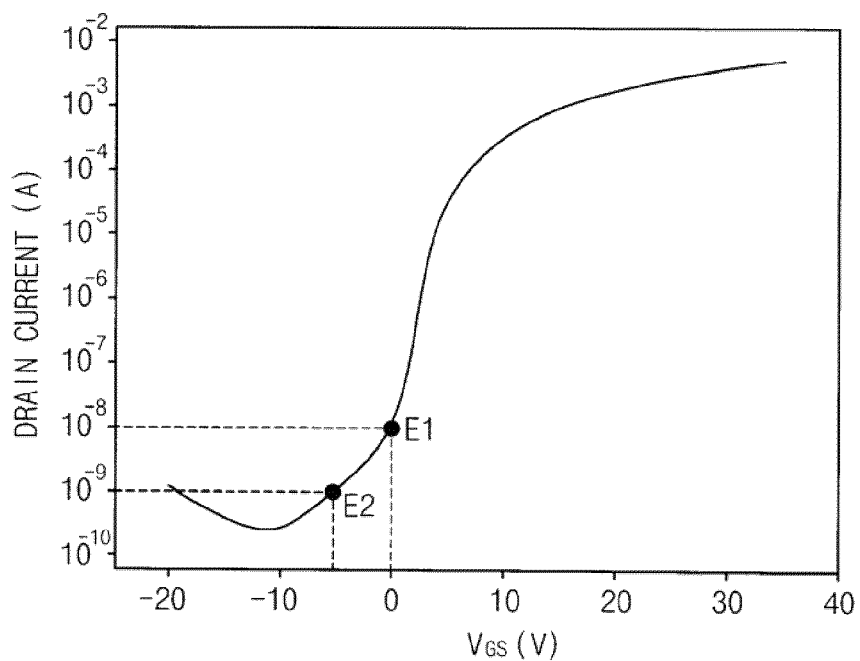
FIG. 5 is a graph illustrating current-voltage characteristics of the pull-up part of FIG. 3.

FIG. 5 is a graph illustrating current-voltage characteristics of the pull-up part 230 of FIG. 3.

Referring to FIGS. 3 and 5, current-voltage characteristics of a first TFT TFT1 included the pull-up part 230 was detected. When a gate/source voltage VGS between the gate and source electrodes of the first TFT TFT1 was about 0 V (E1), the drain current of the first TFT TFT1 was about $10^{-8}$ A. When the gate/source voltage VGS between the gate and source electrodes of the first TFT TFT1 was about −5 V (E2), the drain current of the first TFT TFT1 was about $10^{-9}$ A. Thus, the drain current was lower when the gate/source voltage VGS was about −5 V than when the gate/source voltage VGS was about 0 V. The gate/source voltage VGS may be defined by a difference between a voltage (Qnode_V) of the first output control part (Q node) and a voltage (Onode_V) of the third output control part (O node). For example, VGS=Qnode_V−Onode_V.

Gate driving circuit noise may occur at high temperatures. For example, a display panel driving temperature may be about 35° C. to about 40° C. due to a backlight assembly driving temperature. When the display panel driving temperature increases, the drain current and a threshold voltage Vth of the first TFT TFT1 increase. Thus, the drain current corresponding to the gate/source voltage VGS may increase by more than the about $10^{-8}$ A as shown in FIG. 5. The increased drain current was applied to the first output control part (Q node) of the next stage through the fifteenth TFT TFT15 of the carry part 240. The first TFT TFT1 of the next stage may be bootstrapped during a remaining period of the frame excluding a period in which the next stage was driven, so that the gate driving circuit noise may result from the higher temperature.

Accordingly, the drain current corresponding to the gate/source voltage VGS of the first TFT TFT1 having a negative voltage is less than the drain current ($10^{-8}$ A) corresponding to the gate/source voltage VGS being about 0 V. Thus, gate driving circuit noise may be prevented at the higher temperature.

Figure 6A:
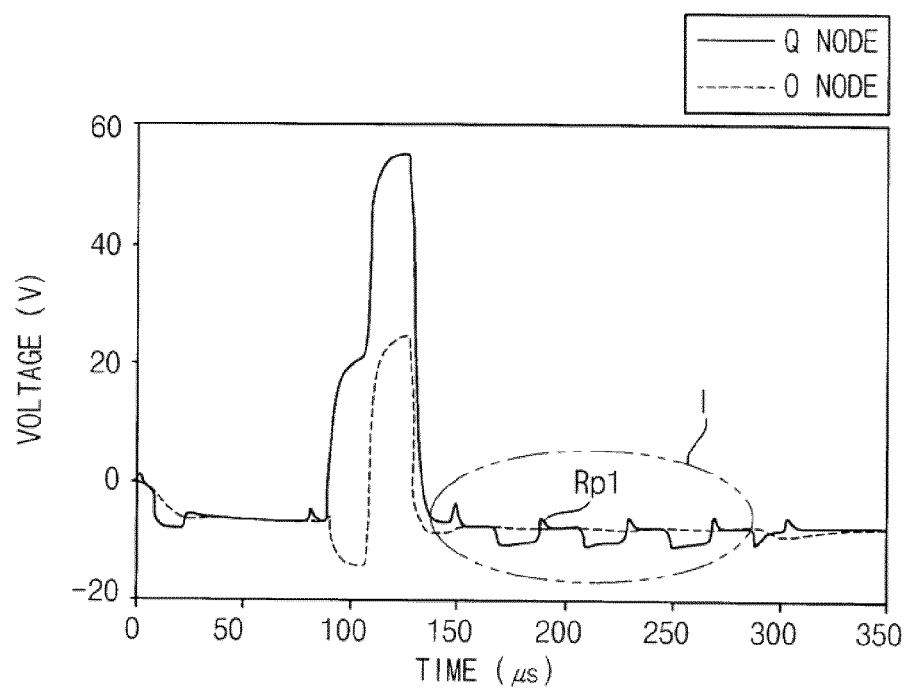
FIGS. 6A and 6B are waveform diagrams illustrating measured signals of a first output control part (Q node) and a third output control part (O node) according to a comparative example.
Figure 6B:
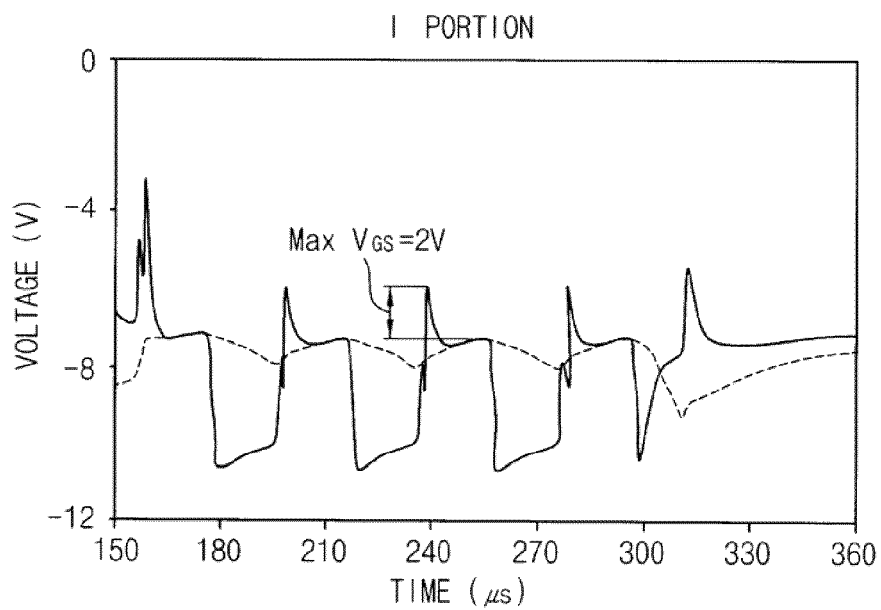
Figure 7:
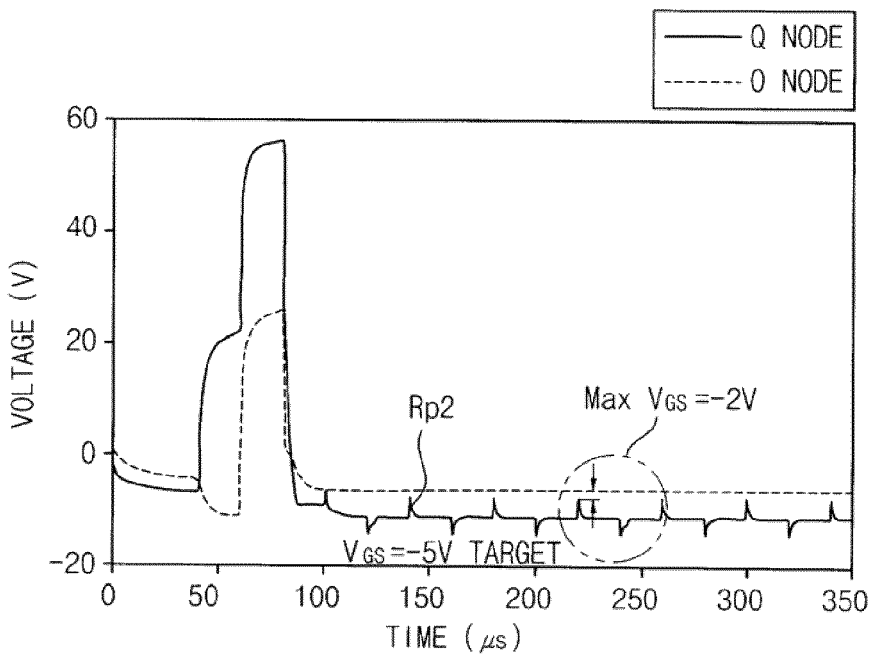
FIG. 7 is a waveform diagram illustrating measured signals of the first output control part (Q node) and the third output control part (O node) according to the exemplary embodiment of the present invention of FIG. 3.

FIGS. 6A and 6B are waveform diagrams illustrating measured signals of a first output control part (Q node) and a third output control part (O node) according to a comparative example. FIG. 6B depicts an enlargement of the circled portion I of FIG. 6A. FIG. 7 is a waveform diagram illustrating measured signals of the first output control part (Q node) and the third output control part (O node) according to the exemplary embodiment of FIG. 3.

FIGS. 6A and 6B are waveform diagrams of signals of the first output control part (Q node) and the third output control part (O node), when a gate/source voltage VGS of the first TFT TFT1 was about 0 V. For example, the gate/source voltage VGS was about 0 V, when low voltages applied to the first output control part (Q node) and the third output control part (O node) were about −7 V, respectively. Thus, the gate/source voltage VGS was −7−(−7)=0 V.

According to the comparative example, a signal applied to the third output control part (O node) has a high voltage during a horizontal period (1H) of the frame and a low voltage (−7 V) during a remaining period of the frame excluding the 1H. A signal applied to the first output control part (Q node) has the bootstrapped voltage during the 1H in which a signal applied to the third output control part (O node) had the high voltage, and the signal applied to the first output control part (Q node) has the low voltage (−7 V) during a remaining period of the frame excluding the 1H. A signal applied to the third output control part (O node) during the remaining period included ripple Rp1, and a maximum of the ripple Rp1 was about 2 V. The ripple Rp1 became the gate/source voltage VGS of the first TFT TFT1.

FIG. 7 is a waveform diagram of signals applied to the first output control part (Q node) and the third output control part (O node), when a gate/source voltage VGS of the first TFT TFT1 was about −5 V. For example, the gate/source voltage VGS was about 15 V, when a low voltage applied to the first output control part (Q node) was about −12 V and a low voltage applied to the third output control part (O node) was about −7 V. Thus, the gate/source voltage VGS was −12−(−7)=−5 V.

According to the present exemplary embodiment, a signal applied to the third output control part (O node) has a high voltage during a horizontal period (1H) of the frame and a first low voltage (−7 V) during a remaining period of the frame excluding the 1H. The signal applied to the first output control part (Q node) has the bootstrapped voltage for the 1H during which a signal applied to the third output control part (O node) has the high voltage, and has the second low voltage (−12 V) during a remaining period of the frame excluding the 1H. The signal applied to the second output control part (N node) during the remaining period included ripple Rp2, and a maximum of the ripple Rp2 was about −2 V. The ripple Rp2 became the gate/source voltage VGS of the first TFT TFT1.

Therefore, the maximum of the ripple Rp2 according to the present exemplary embodiment was about −2 V and the maximum of the ripple Rp1 according to the comparative example was about 2 V. The drain current corresponding to the ripple Rp2 was less than the drain current corresponding to the ripple Rp1. When the gate/source voltage VGS was negative, according to the present exemplary embodiment, the noise of the gate driving circuit may be reduced.

Figure 8:
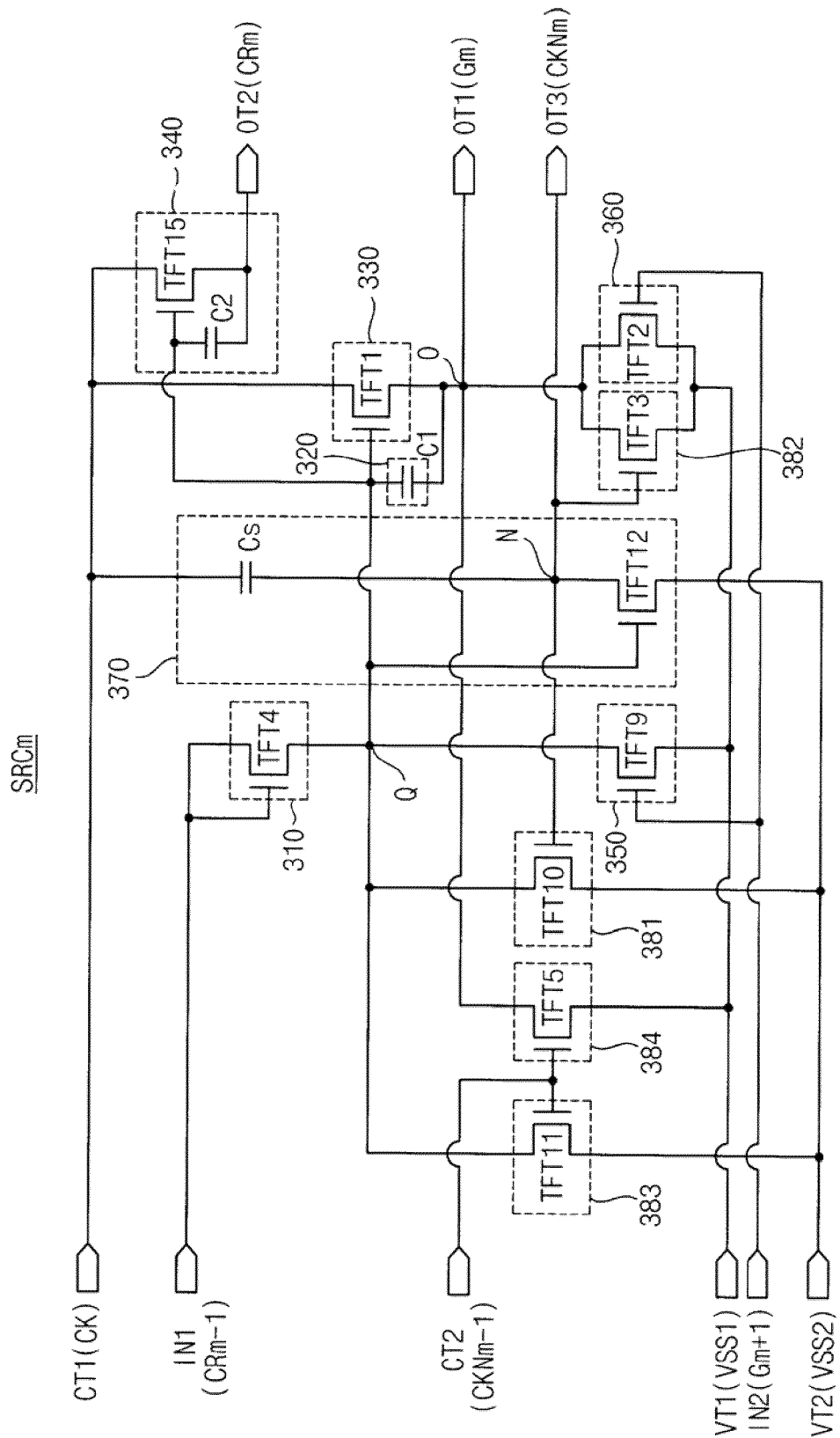
FIG. 8 is a circuit diagram illustrating a stage according to another exemplary embodiment of the present invention.

FIG. 8 is a circuit diagram illustrating a stage according to another exemplary embodiment of the present invention. Hereinafter, the same reference numerals will be used to refer to the same or like parts as those described in the previous exemplary embodiment of FIG. 1, and any further repetitive explanation concerning the above elements will be omitted.

Referring to FIGS. 3 and 8, an m-th stage SRCm includes a buffer part 310, a charging part 320, a pull-up part 330, a carry part 340, a discharging part 350, a pull-down part 360, a switching part 370, a first holding part 381, a second holding part 382, a third holding part 383 and a fourth holding part 384.

The buffer part 310 includes a fourth TFT TFT4, and a control part and an input part of the buffer part 310, such as a gate electrode and a source electrode of the fourth TFT TFT4, are connected to the first input terminal IN1, and an output part of the buffer part 310, such as a drain electrode of the fourth TFT TFT4, is connected to the first output control part (Q node). The first output control part (Q node) is connected to a first part of the charging part 320. When a high voltage VDD of the (m−1)-th carry signal CRm−1, that is, an output signal of the previous stage (e.g., an (m−1)-th stage), is received by the first input terminal IN1, the buffer part 310 outputs a first voltage V1 corresponding to the high voltage VDD. The charging part 320 charges the capacitor C1 to the first voltage V1 corresponding to the high voltage VDD.

The pull-up part 330 includes a first TFT TFT1, and a control part of the pull-up part 330, such as a gate electrode of the first TFT TFT1, is connected to the first output control part (Q node). An input part of the pull-up part 230, such as a source electrode of the first TFT TFT1, is connected to the first clock terminal CT1, and an output part of the pull-up part 230, such as a drain electrode of the first TFT TFT1, is connected to the third output control part (O node). In a state in which a first voltage V1 of the charging part 320 is applied to the control part of the pull-up part 330, when a high voltage VDD of the first clock signal CK is received by the input part of the pull-up part 330, the pull-up part 330 is bootstrapped. When a boosting voltage VBT is applied to the control part of the pull-up part 330 during the m-th period Tm, pull-up part 330 outputs as a high voltage VDD of an m-th gate signal Gm a high voltage of the first clock signal CK.

The carry part 340 includes a fifteenth TFT TFT15, and a control part of the carry part 340, such as a gate electrode of the fifteenth TFT TFT15, is connected to the first output control part (Q node). An input part of the carry part 340, such as a source electrode of the fifteenth TFT TFT15, is connected to the first clock terminal CT1, and an output part of the carry part 340, such as a drain electrode of the fifteenth TFT TFT15, is connected to the second output terminal OT2. The carry part 340 includes a capacitor C2 connected to the control part and the output part of the carry part 340. When a high voltage is applied to the first output control part (Q node), the carry part 340 outputs as the high voltage of the m-th carry signal CRm the high voltage VDD of the first clock signal CK received by the first clock terminal CT1.

The discharging part 350 includes a ninth TFT TFT9, and a control part of the discharging part 350, such as a gate electrode of the ninth TFT TFT9, is connected to the second input terminal IN2. An input part of the discharging part 350, such as a source electrode of the ninth TFT TFT9, is connected to the first output control part (Q node), and an output part of the discharging part 350, such as a drain electrode of the ninth TFT TFT9, is connected to the first voltage terminal VT1. When the high voltage VDD of the (m+1)-th gate signal Gm+1 is received by the second input terminal IN2, the discharging part 350 discharges to first voltage terminal VT1 the first low voltage VSS1 received from the first output control part (Q node).

The switching part 370 includes a capacitor Cs and a twelfth TFT TFT12. The capacitor Cs includes a first electrode connected to the first clock terminal CT1 and a second electrode connected to the second output control part (N node). A control part of the twelfth TFT TFT12, such as a gate electrode, is connected to the first output control part (Q node), an input part of the twelfth TFT TFT12 such as a source electrode, is connected to the second output control part (N node), and an output part of the twelfth TFT TFT12 such as a drain electrode, is connected to the second voltage terminal VT2.

The twelfth TFT TFT12 is turned on during the (m−1)-th period Tm−1 and the m-th period Tm of the frame, during which a high voltage is applied to the first output control part (Q node) and the switching part 370 discharges a voltage applied to the second output control part (N node) to the second low voltage VSS2. The twelfth TFT TFT12 is turned off during a remaining period of the frame excluding the m-th period Tm, during which a low voltage is applied to the first output control part (Q node) and the switching part 370 applies to the second output control part (N node) the m-th N node signal CKNm, which has substantially the same phase as the first clock signal CK. A high voltage Vdd of the m-th N node signal CKNm is lower than a high voltage VDD of the first clock signal CK by a voltage difference of the capacitor Cs.

The first holding part 381 includes a tenth TFT TFT10, and a control part of the first holding part 381, such as a gate electrode of the tenth TFT TFT10, is connected to the second output control part (N node). An input part of the first holding part 381, such as a source electrode of the tenth TFT TFT10, is connected to the first output control part (Q node), and an output part of the first holding part 381, such as a drain electrode of the tenth TFT TFT10, is connected to the second voltage terminal VT2. The first holding part 381 holds a voltage of the first output control part (Q node) as the second low voltage VSS2 in response to the m-th N node signal CKNm during a remaining period of the frame excluding the m-th period Tm.

The second holding part 382 includes a third TFT TFT3, and a control part of the second holding part 382, such as a gate electrode of the third TFT TFT3, is connected to the second output control part (N node). An input part of the second holding part 382, such as a source electrode of the third TFT TFT3, is connected to the third output control part (O node), and an output part of the second holding part 382, such as a drain electrode of the third TFT TFT3, is connected to the first voltage terminal VT1. The second holding part 382 holds a voltage of the third output control node (O node) as the first low voltage VSS1 in response to the m-th N node signal CKNm during a remaining period of the frame excluding the m-th period Tm.

The third holding part 383 includes an eleventh TFT TFT11, and a control part of the third holding part 383, such as a gate electrode of the eleventh TFT TFT11, is connected to the second clock terminal CT2. An input part of the third holding part 383, such as a source electrode of the eleventh TFT TFT11, is connected to the first output control part (Q node), and an output part of the third holding part 383, such as a drain electrode of the eleventh TFT TFT11, is connected to the second voltage terminal VT2. The third holding part 383 holds a voltage of the first output control part (Q node) as the second low voltage VSS2 in response to the (m−1)-th N node signal CKNm−1 during a remaining period of the frame excluding the m-th period Tm.

The fourth holding part 384 includes a fifth TFT TFT5, and a control part of the fourth holding part 384, such as a gate electrode of the fifth TFT TFT5, is connected to the second clock terminal CT2. An input part of the fourth holding part 384, such as a source electrode of the fifth TFT TFT5, is connected to the third output control part (0 node), and an output part of the fourth holding part 384, such as a drain electrode of the fifth TFT TFT5, is connected to the first voltage terminal VT1. The fourth holding part 384 holds a voltage of the third output control part (O node) as the first low voltage VSS1 in response to the (m−1)-th N node signal CKNm−1 during a remaining period of the frame excluding the m-th period Tm.

According to the present exemplary embodiment, the gate/source voltage VGS is negative to reduce noise of the gate driving circuit at high temperatures. A voltage level applied to the second output control part (N node) may be controlled by the capacitance of the capacitor Cs, to prevent damage to the first to fourth holding parts 381, 382, 383 and 384 due to long driving durations. Therefore, the gate driving circuit may be protected from high temperature noise.

Figure 9:
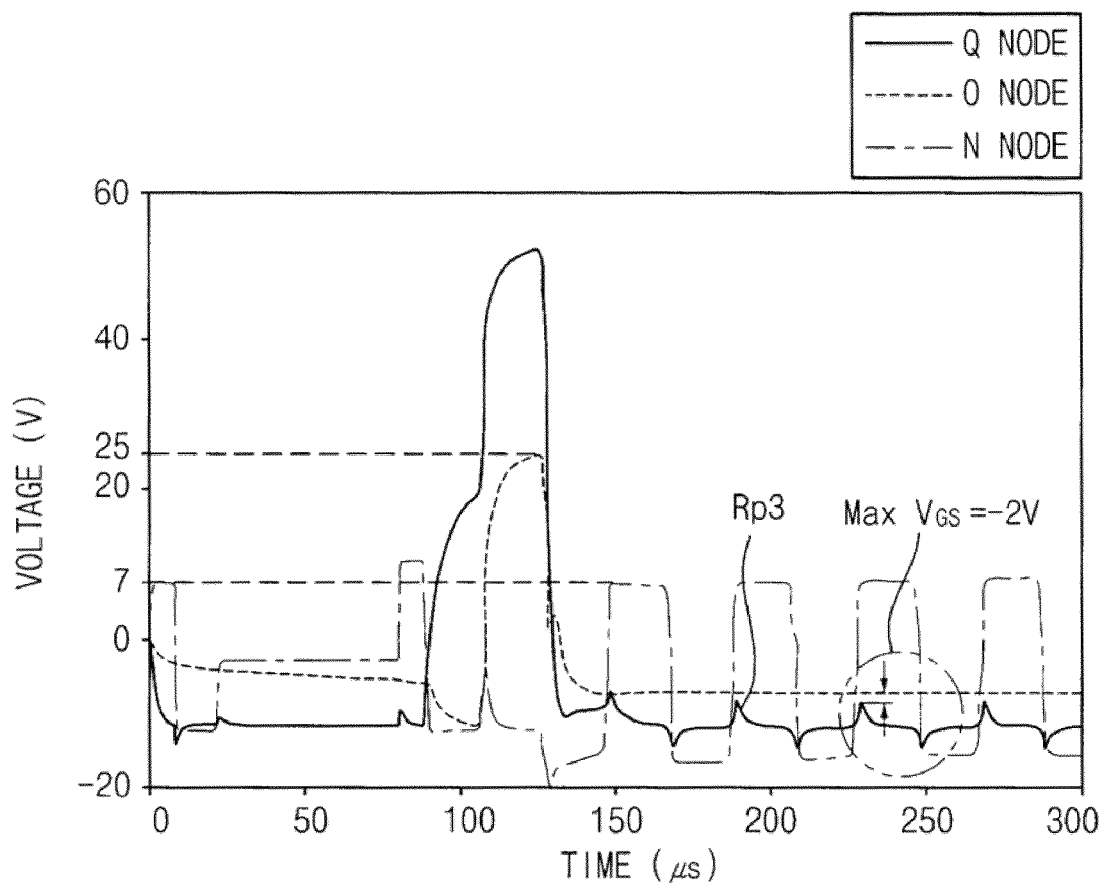
FIG. 9 is a waveform diagram illustrating measured signals of the first output control part (Q node) and the third output control part (O node) of FIG. 8.

FIG. 9 is a waveform diagram illustrating measured signals of the first output control part (Q node) and the third output control part (O node) of FIG. 8.

Referring to FIGS. 8 and 9, FIG. 9 is a waveform diagram of signals of the first output control part (Q node) and the third output control part (O node), when a gate/source voltage VGS of the first TFT TFT1 was about −5 V and the capacitance of the capacitor Cs was about 3 f.

A signal of the third output control part (O node) has a high voltage during a horizontal period (1H) of the frame and the first low voltage (VSS1=−7 V) during a remaining period of the frame excluding the 1H. A signal of the first output control part (Q node) has the bootstrapped voltage for the 1H in which a signal of the third output control part (O node) has the high voltage, and the second low voltage (VSS2=−12 V) during a remaining period of the frame excluding the 1H. A high voltage of the second output control part (N node) was about 7 V and a high voltage of the third output control part (O node) was about 25 V. The high voltage of the third output control part (O node) was higher than the high voltage of the second output control part (N node).

Therefore, a low voltage of the third output control part (N node) was controlled by using the signal of second output control part (N node) so that a peak of a ripple Rp3 of the first output control part (Q node) was decreased in comparison with the comparative example as shown in FIGS. 6A and 6B.

According to the present exemplary embodiment, the signal of the third output control part (O node) corresponding to the remaining period included the ripple Rp3 and a maximum of the ripple Rp3 was about −2 V. The signal level applied to the second output control part (N node) is controlled by adjusting the capacitance of the capacitor Cs to decrease a peak of the ripple Rp3.

Therefore, the gate/source voltage VGS is negative to protect the gate driving circuit from high temperature noise. First to fourth holding parts 381, 382, 383 and 384 may be prevented from damage due to long driving durations.

Figure 10:
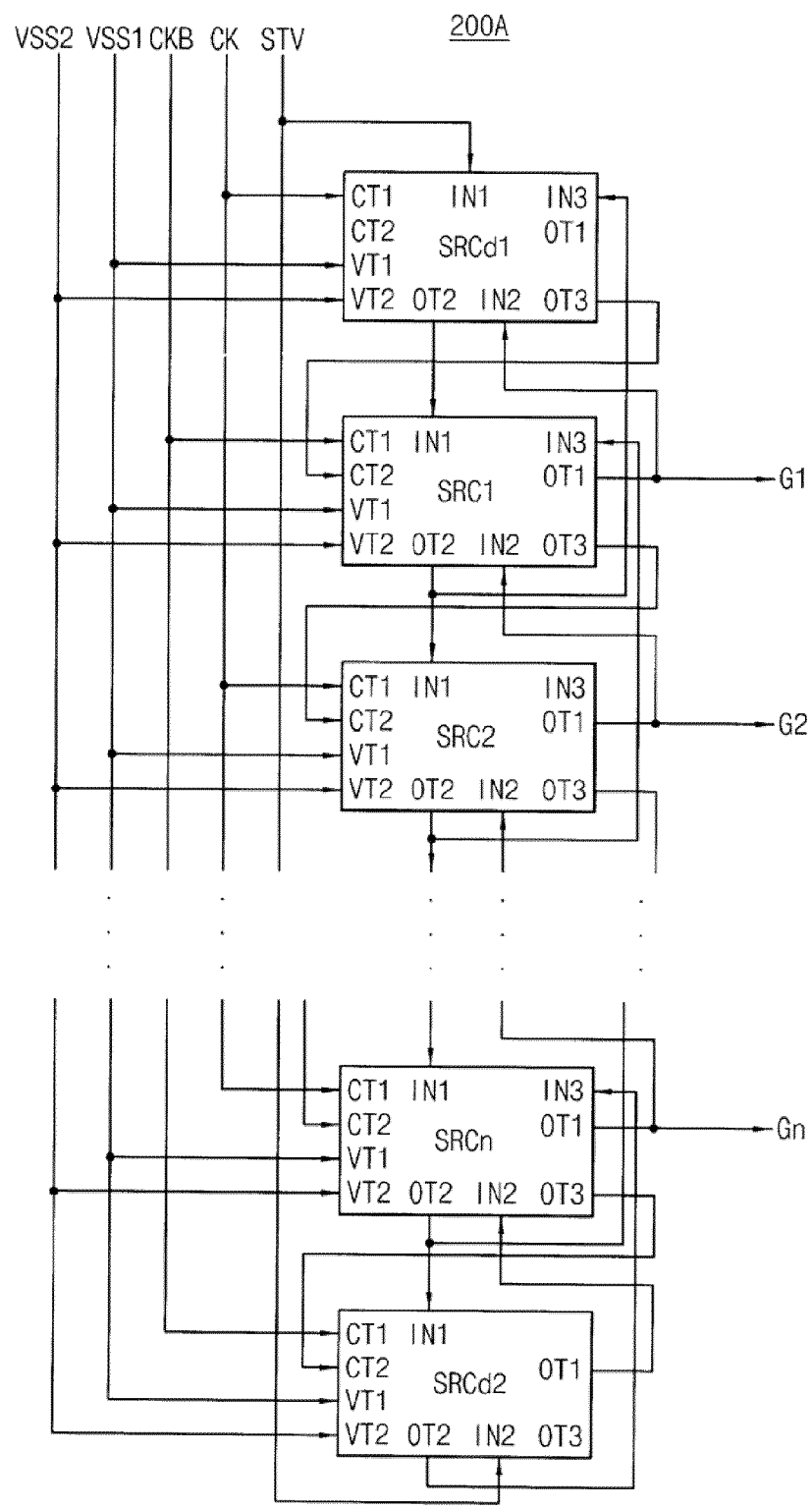
FIG. 10 is a block diagram illustrating a gate driving circuit according to still another exemplary embodiment of the present invention.

FIG. 10 is a block diagram illustrating a gate driving circuit according to another exemplary embodiment of the present invention.

Referring to FIG. 10, the gate driving circuit 200A includes a shift register including a first stage SRC1 to an n-th stage SRCn dependently connected to each other, a first dummy stage SRCd1 and a second dummy stage SRCd2.

The first stage SRC1 to the n-th stage SRCn are connected to n gate lines GL1, GL2, GL3, . . . , and GLn, respectively, to sequentially output n gate signals to the gate lines GL1, GL2, GL3, . . . , and GLn. The first dummy stage SRCd1 controls the driving of the first stage SRC1, and the second dummy stage SRCd2 controls the driving of the n-th stage SRCn. The first dummy stage SRCd1 and the second dummy stage SRCd2 are not connected to the gate lines GL.

Comparing to the stage in FIG. 2, each stage includes a first clock terminal CT1, a second clock terminal CT2, a first input terminal IN1, a second input terminal IN2, a third input terminal IN3, a first voltage terminal VT1, a second voltage terminal VT2, a first output terminal OT1, a second output terminal OT2 and a third output terminal OT3. The third output terminal OT3 of the second dummy stage SRCd2 may be electrically floated.

The first clock terminal CT1, the second clock terminal CT2, the first input terminal IN1, the second input terminal IN2, the first voltage terminal VT1, the second voltage terminal VT2, the first output terminal OT1, the second output terminal OT2 and the third output terminal OT3 are substantially the same elements as described with reference to FIG. 2 and any further repetitive explanation concerning the above elements will be omitted.

The third input terminal IN3 receives a carry signal outputted to a second output terminal OT2 of a next stage. For example, the third input terminal IN3 of first stage SRC1 receives a second carry signal outputted to a second output terminal OT2 of a second stage SRC2. The second carry signal controls a discharging part (not shown) of the first stage SRC1.

Figure 11:
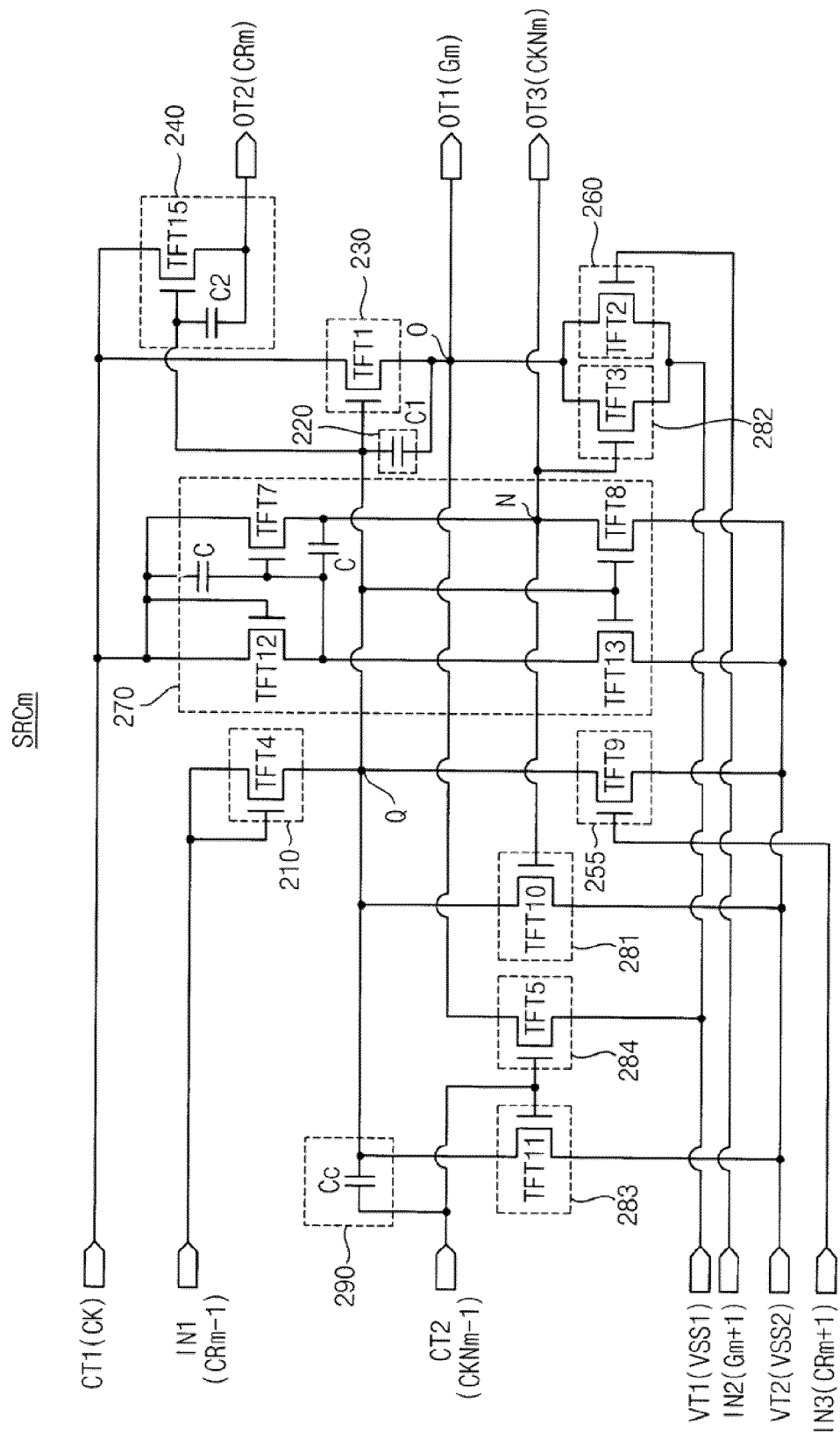
FIG. 11 is a circuit diagram illustrating a stage of FIG. 10.
Figure 12:
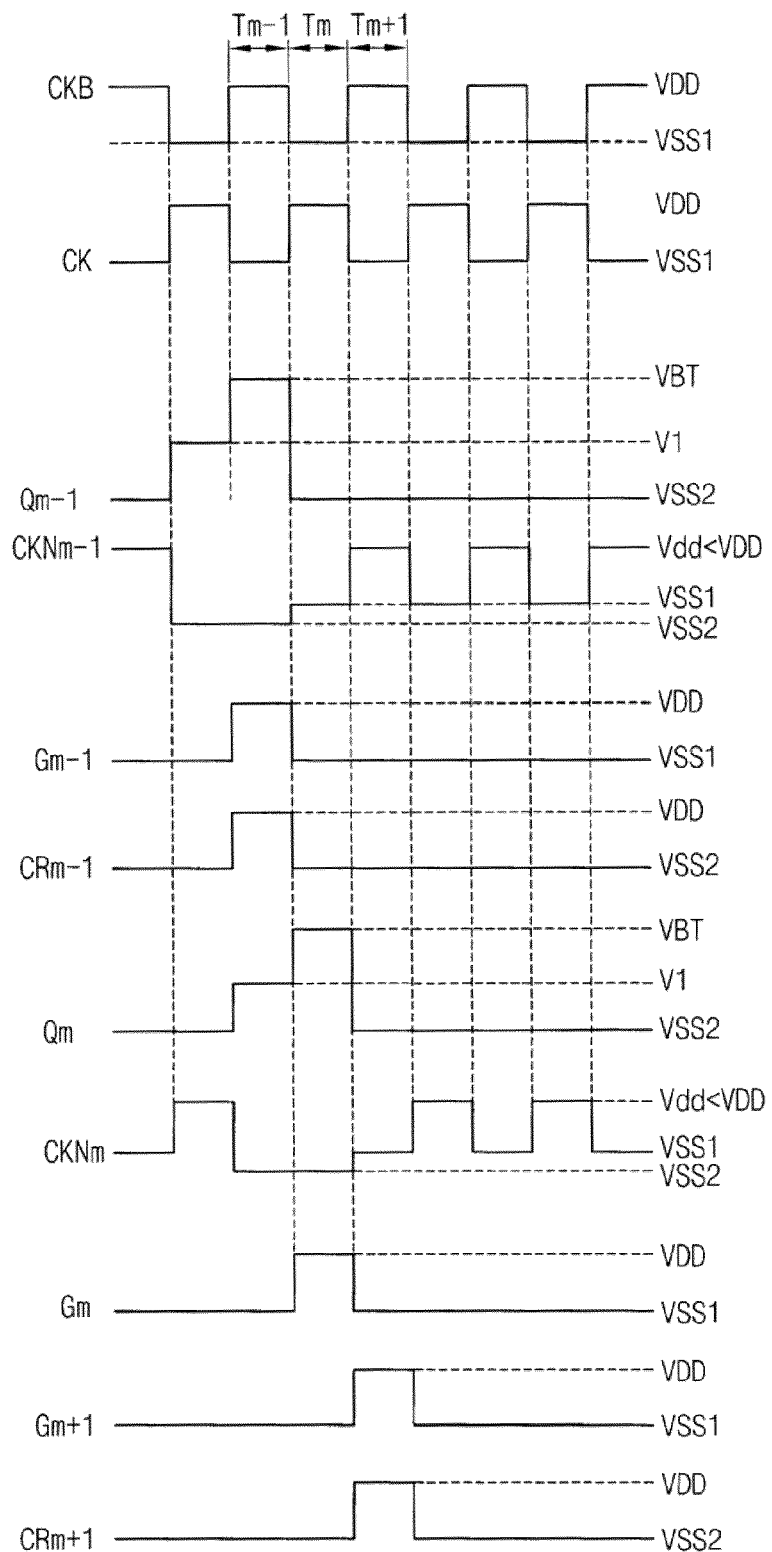
FIG. 12 is a waveform diagram illustrating input/output signals of the gate driving circuit of FIG. 11.

FIG. 11 is a circuit diagram illustrating a stage of FIG. 10. FIG. 12 is a waveform diagram illustrating input/output signals of a gate driving circuit of FIG. 11.

An m-th stage SRCm shown in FIG. 11, is substantially the same as the m-th stage SRCm described with reference to FIG. 3, except that FIG. 11 includes a discharging part 255 and a compensation charging part 290. Hereinafter, the same reference numerals will be used to refer to the same or like parts as those described in the previous exemplary embodiment of FIG. 3, and any further repetitive explanation concerning the above elements will be simply described.

Referring to FIGS. 11 and 12, the m-th stage SRCm includes a buffer part 210, a charging part 220, a pull-up part 230, a carry part 240, a discharging part 255, a pull-down part 260, a switching part 270, a first holding part 281, a second holding part 282, a third holding part 283, a fourth holding part 284 and a compensation charging part 290.

When a high voltage VDD of the (m−1)-th carry signal CRm−1 is received, the charging part 220 outputs a first voltage V1 corresponding to the high voltage VDD.

The pull-up part 230 includes a first TFT TFT1, and a control part of the pull-up part 230, such as a gate electrode of the first TFT TFT1, is connected to a first part of the charging part 220. An input part of the pull-up part 230, such as a source electrode of the first TFT TFT1, is connected to the first clock terminal CK1, and an output part of the pull-up part 230, such as a drain electrode of the first TFT TFT1, is connected to third output control part (O node). The charging part 220 includes a capacitor C1 comprising a first electrode connected to the first output control part (Q node) and a second electrode connected to the third output control part (O node).

In a state in which a first voltage V1 of the charging part 220 is applied to the control part of the pull-up part 230, when a high voltage VDD of the first clock signal CK is received by the input part of the pull-up part 230, the pull-up part 230 is bootstrapped. In this case, the first voltage V1 of the control part (Q node) connected to the pull-up part 230 is raised to a boosting voltage VBT.

When the boosting voltage VBT is applied to the control part of the pull-up part 230 at the m-th period Tm, the pull-up part 230 outputs as the high voltage of the m-th gate signal Gm the high voltage VDD of the first clock signal CK received by the first clock terminal CT1.

The carry part 240 includes a fifteenth TFT TFT15, and a control part of the carry part 240, such as a gate electrode of the fifteenth TFT TFT15, is connected to the first output control part (Q node). An input part of the carry part 240, such as a source electrode of the fifteenth TFT TFT15, is connected to the first clock terminal CT1, and an output part of the carry part 240, such as a drain electrode of the fifteenth TFT TFT15, is connected to the second output terminal OT2. The carry part 240 further includes a capacitor C2 connected to the control part and the output part of the carry part 240. When a high voltage is applied to the first output control part (Q node), the carry part 240 outputs the high voltage VDD of the first clock signal CK received by the first clock terminal CT1 as the high voltage of the m-th carry signal CRm. When a second low voltage VSS2 is applied to the first output control part (Q node), the carry part 240 outputs the second low voltage VSS2 of the first clock signal CK received by the first clock terminal CT1 as the low voltage of the m-th carry signal CRm. The carry part 240 outputs the high voltage VDD of the m-th carry signal CRm at the m-th period Tm and outputs the second low voltage VSS2 during a remaining period of the frame excluding the m-th period Tm.

The discharging part 255 includes a ninth TFT TFT9, and a control part of the discharging part 255, such as a gate electrode of the ninth TFT TFT9, is connected to the third input terminal IN3. An input part of the discharging part 255, such as a source electrode of the ninth TFT TFT9, is connected to the first output control part (Q node), and an output part of the discharging part 255, such as a drain electrode of the ninth TFT TFT9, is connected to the second voltage terminal VT2. When the (m+1)-th carry signal CRm+1 is received by the third input terminal IN3, the discharging part 255 discharges to the second voltage terminal VT2 a second low voltage VSS2 of the first output control part (Q node).

The (m+1)-th carry signal CRm+1 has the high voltage VDD at an (m+1)-th period Tm+1 and has the second low voltage VSS2 during a remaining period of the frame excluding the (m+1)-th period Tm+1. When the m-th stage SRCm outputs an m-th gate signal Gm of the first low voltage VSS1, a voltage between the control part and source part of the discharging part 255, such as a gate/source voltage VGS between the gate electrode and the source electrode of the ninth TFT TFT9, is about 0 V. The input part of the discharging part 255 receives the second low voltage VSS2 of the first output control part (Q node) and the control part of the discharging part 255 receives the second low voltage VSS2 of the (m+1)-th carry signal CRm+1. Thus, the gate/source voltage VGS of the ninth TFT TFT9 is −12 V−(−12 V)=0 V.

A bias condition of the discharging part 255 may be held to about 0 V so that the discharging part 255 to prevented damage due to high temperatures. When first to fourth holding parts 281, 282, 283 and 284 are damaged by long driving durations, the gate/source voltage VGS of the pull-up part 230 may be held negative by the discharging part 255. Thus, a gate driving circuit driving margin may be obtained at high temperatures.

When a high voltage of the (m+1)-th gate signal Gm+1 is received by second input terminal IN2, the pull-down part 260 discharges the first low voltage VSS1 of the third output control part (O node) to the first voltage terminal VT1.

The switching part 270 includes a twelfth TFT TFT12, a seventh TFT TFT7, a thirteenth TFT TFT13 and a eighth TFT TFT8. The switching part 270 discharges a voltage applied to the second output control part (N node) to the second low voltage VSS2 during the (m−1)-th and m-th periods Tm−1 and Tm in which a high voltage is applied to the first output control part (Q node). The eighth TFT TFT8 and the thirteenth TFT TFT13 are turned on in response to the high voltage applied to the first output control part (Q node) so that the second output control part (N node) is discharged to the second low voltage VSS2.

When a low voltage is applied to the first output control part (Q node) during a remaining period of the frame excluding the m-th period Tm, the switching part 270 applies to the second output control part (N node) an m-th N node signal CKNm that has substantially the same phase as the first clock signal CK received by the first clock terminal CT1. When the low voltage is applied to the first output control part (Q node), the eighth TFT TFT8 and the thirteenth TFT TFT13 are turned off. Thus, the m-th N node signal CKNm having a high voltage Vdd lower than the high voltage VDD of the first clock signal CK is applied to the second output control part (N node). The high voltage Vdd of the m-th N node signal CKNm is substantially the same as the high voltage VDD of the first clock signal CK dropped by the seventh TFT TFT7, the twelfth TFT TFT12 and a parasitic capacitor C.

The first holding part 281 holds a voltage applied to the first output control part (Q node) as the second low voltage VSS2 in response to the high voltage Vdd of the m-th N node signal CKNm during a remaining period of the frame excluding the m-th period Tm. The m-th N node signal CKNm has substantially the same phase as the first clock signal CK. The second holding part 282 holds a voltage applied to the third output control part (O node) as the first low voltage VSS1 in response to the high voltage Vdd of the m-th N node signal CKNm during a remaining period of the frame excluding the m-th period Tm.

The third holding part 283 holds a voltage applied to the first output control part (Q node) as the second low voltage VSS2 in response to the high voltage Vdd of the (m−1)-th N node signal CKNm−1 during a remaining period of the frame excluding the m-th period Tm. The (m−1)-th N node signal CKNm−1 has substantially the same phase as the second clock signal CKB, which has a phase opposite to the first clock signal CK. The fourth holding part 284 holds a voltage applied to the third output control part (O node) as the first low voltage VSS1 in response to the high voltage Vdd of the (m−1)-th N node signal CKNm−1 during a remaining period of the frame excluding the m-th period Tm.

The compensation charging part 290 includes a capacitor Cc having a first electrode of the capacitor Cc connected to the second clock terminal CT2 and a second electrode of the capacitor Cc connected to the first output control part (Q node). The second clock terminal CT2 receives the (m−1)-th N node signal CKNm−1. The compensation charging part 290 increases a discharging time during which a voltage of the first output control part (Q node) is discharged to the second low voltage VSS2.

The bootstrapped voltage VBT applied to the first output control part (Q node) is discharged to the second low voltage VSS2 via the first holding part 281. The first holding part 281 increases the discharging time using a voltage charged in the compensation charging part 290.

For example, in this case, the bootstrapped voltage VBT applied to the first output control part (Q node) is about 48 V, the first low voltage VSS1 is about −7 V, the second low voltage VSS2 is about −12 V, and the first output control part (Q node) is quickly discharged to about −12 V through the second holding part 281. A discharging time of the first output control part (Q node) is shortened so that a time for a voltage of the third output control part (O node) to be discharged to about −7 V through the first TFT TFT1 of the pull-up part 230 is shortened. The third output control part (O node) is electrically floated before the pull-down part 260 is turned on. A signal of the third output control part (O node) causes a bump at a pulling edge of the m-th gate signal Gm by a coupling between the (m+1)-th and the m-th gate signal Gm+1 and Gm.

Therefore, the compensation charging part 290 increases the discharging time, that is, a driving time of the first holding part 281, in which the voltage of the first output control part (Q node) is discharged to the second low voltage VSS2 by the first holding part 281, thus improving the bump of the m-th gate signal Gm caused by the coupling between the (m+1)-th and the m-th gate signal Gm+1 and Gm.

The phase of the (m−1)-th N node signal CKNm−1 charged in the capacitor Cc of the compensation charging part 290 is opposite to the phase of a Q node signal Qm applied to the first output control part (Q node). When the Q node signal Qm is pulled down, the (m−1)-th N node signal CKNm−1 pulls up. Thus, the discharging time of the first output control part (Q node) may be increased. In addition, the (m−1)-th node signal CKNm−1 has the low voltage during the m-th period Tm−1 in which the first output control part (Q node) is pre-charged by the charging part 210, so that the first output control part (Q node) may be easily pre-charged.

Figure 13:
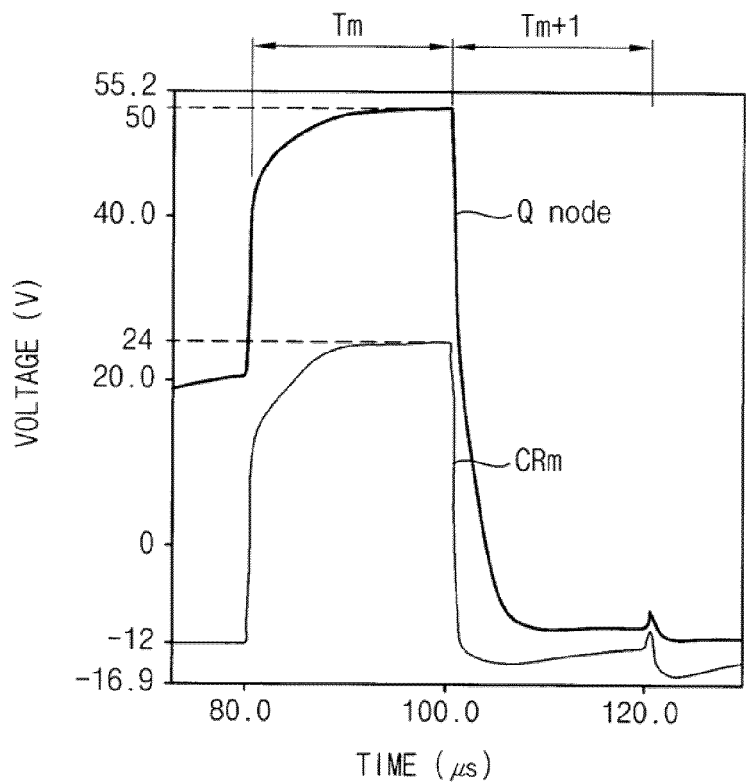
FIG. 13 waveform diagram illustrating measured signals of the first output control part (Q node) and the second output terminal of FIG. 11.

FIG. 13 waveform diagram illustrating measured signals of the first output control part (Q node) and the second output terminal OT2 of FIG. 11.

Referring to FIGS. 11 and 13, the gate driving circuit was driven when the first low voltage VSS1 was about −7 V, the second low voltage VSS2 was about −12 V, the high voltage VDD was about 21 V, and the low voltage of the first clock signal CK was about −7 V.

In the m-th period Tm, the first output control part (Q node) of the m-th stage was bootstrapped to about 50 V, and the carry part 240 of the m-th stage outputted the m-th carry signal CRm having a high voltage of about 24 V. After this, in the remaining period Tm+1, . . . , of the frame excluding the m-th period Tm, the first output control part (Q node) was held to the second low voltage VSS2 of about −12 V and the carry part 240 outputted the m-th carry signal CRm having the second low voltage of about −12 V.

The discharging part 255 of the m-th stage SRCm was controlled by the (m+1)-th carry signal CRm+1 of the (m+1)-th stage SRCm+1. Therefore, the gate/source voltage VGS of the discharging part 255 may be held to about 0 V during a period in which the discharging part 255 was turned off by the (m+1)-th carry signal CRm+1 having the second low voltage VSS2. When first to fourth holding parts 281, 282, 283 and 284 were damaged by a long driving duration, the gate/source voltage VGS of the pull-up part 230 may be held negative by the discharging part 255. Thus, a gate driving circuit driving margin may be obtained at high temperatures.

Figure 14:
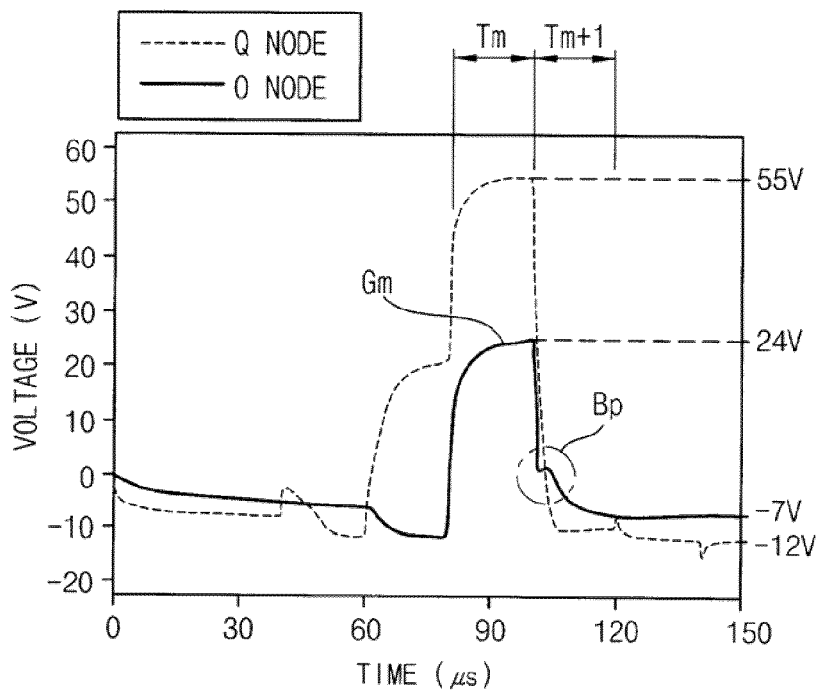
FIG. 14 waveform diagram illustrating measured signals of a third output control part (O node) of FIG. 11.

FIG. 14 waveform diagram illustrating measured signals of a third output control part (O node) of FIG. 11.

Referring to FIGS. 11 and 14, the first low voltage VSS1 of about −7 V, the second low voltage VSS2 of about −12 V, and the first clock signal CK having a high voltage VDD of about 24 V and a low voltage of about −7 V, were provided to the gate driving circuit, including the capacitor Cc of the compensation charging part 290, to drive the gate driving circuit.

The first output control part (Q node) was bootstrapped to about 55 V during the m-th period Tm, and quickly discharged to about −12 V via second holding part 281 during the (m+1)-th period Tm+1. The third output control part (O node) has about 24 V corresponding to the high voltage of the m-th gate signal Gm in response to the voltage of the first output control part (Q node) during the m-th period Tm, and had about −7 V corresponding to the low voltage of the m-th gate signal Gm discharged by the pull-down part 260 during the (m+1)-th period Tm+1. A discharging time of the first output control part (Q node) was increased by a voltage charged in the compensation charging part 290, during which the voltage (about 55 V) of the first output control part (Q node) was discharged to the voltage (about −12 V) of the first output control part (Q node) by the first holding part 281. The third output control part (O node) was prevented from being floated before the pull-down part 260 was turned on.

Therefore, the bump Bp of the m-th gate signal Gm caused by the coupling between the (m+1)-th and the m-th gate signal Gm+1 and Gm, may be improved.

Figure 15:
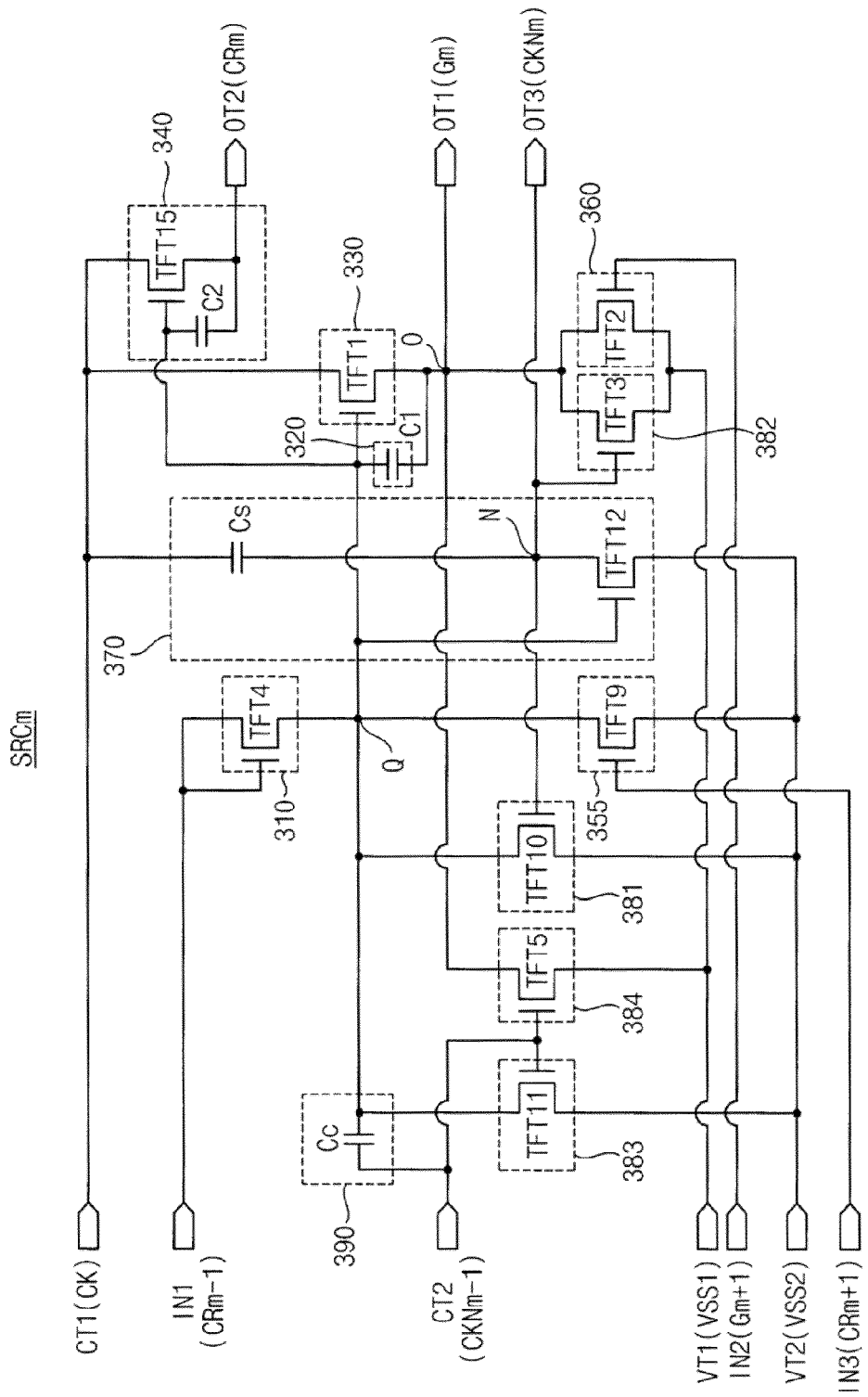
FIG. 15 is a circuit diagram illustrating a stage according to still another exemplary embodiment of the present invention.

FIG. 15 is a circuit diagram illustrating a stage according to another exemplary embodiment of the present invention.

An m-th stage SRCm shown in FIG. 15, is substantially the same as the m-th stage SRCm described with reference to FIG. 8, except that FIG. 15 includes a discharging part 355 and a compensation charging part 390. Hereinafter, the same reference numerals will be used to refer to the same or like parts as those described in the previous example embodiment of FIG. 8, and any further repetitive explanation concerning the above elements will be simplify described.

Referring to FIGS. 12 and 15, the m-th stage SRCm includes a buffer part 310, a charging part 320, a pull-up part 330, a carry part 340, a discharging part 355, a pull-down part 360, a switching part 370, a first holding part 381, a second holding part 382, a third holding part 383, a fourth holding part 384, and a compensation charging part 390.

When a high voltage VDD of the (m−1)-th carry signal CRm−1 outputted from the previous stage (e.g., an (m−1)-th stage), is received by the first input terminal IN1, the charging part 320 charges the capacitor C1 to the first voltage V1 corresponding to the high voltage VDD.

In a state in which the first voltage V1 charged in the charging part 320 is applied to the control part of the pull-up part 330, when a high voltage VDD of the first clock signal CK is received by the input part of the pull-up part 330, the pull-up part 330 is bootstrapped. When a boosting voltage VBT is applied to the control part of the pull-up part 330 during the m-th period Tm, the pull-up part 330 outputs a high voltage VDD of the first clock signal CK to the m-th gate signal Gm.

The carry part 340 includes a fifteenth TFT TFT15, and a control part of the carry part 340, such as a gate electrode of the fifteenth TFT TFT15, is connected to the first output control part (Q node). An input part of the carry part 340, such as a source electrode of the fifteenth TFT TFT15, is connected to the first clock terminal CT1, and an output part of the carry part 340, such as a drain electrode of the fifteenth TFT TFT15, is connected to the second output terminal OT2. The carry part 340 further includes a capacitor C2 connected to the control part and the output part of the carry part 340. When a high voltage is applied to the first output control part (Q node), the carry part 340 outputs as the m-th carry signal CRm the high voltage VDD of the first clock signal CK received by the first clock terminal CT1. When a second low voltage VSS2 is applied to the first output control part (Q node), the carry part 340 outputs as the m-th carry signal CRm the second low voltage VSS2 of the first clock signal CK received by the first clock terminal CT1. The carry part 240 outputs the high voltage VDD of the m-th carry signal CRm during the m-th period Tm, and outputs the second low voltage VSS2 during a remaining period of the frame excluding the m-th period Tm.

The discharging part 355 includes a ninth TFT TFT9 and a control part of the discharging part 355, such as a gate electrode of the ninth TFT TFT9, is connected to the third input terminal IN3. An input part of the discharging part 355, such as a source electrode of the ninth TFT TFT9, is connected to the first output control part (Q node), and an output part of the discharging part 355, such as a drain electrode of the ninth TFT TFT9, is connected to the first voltage terminal VT1. When the (m+1)-th gate signal Gm+1 is received by the second input terminal IN2, the discharging part 355 discharges a first low voltage VSS1 received from the first output control part (Q node) to the first voltage terminal VT1.

The (m+1)-th carry signal CRm+1 has the high voltage VDD during the (m+1)-th period Tm+1, and has the second low voltage VSS2 during a remaining period of the frame excluding the (m+1)-th period Tm+1. When the m-th stage SRCm outputs the first low voltage VSS1 of the m-th gate signal Gm, the gate/source voltage VGS of the discharging part 355 is about 0 V. The input part of the discharging part 355 receives the second low voltage VS S2 applied to the second voltage terminal VT2, and the control part of the discharging part 355 receives the second low voltage VSS2 of the (m+1)-th carry signal CRm+1. Therefore, the gate/source voltage VGS of the discharging part 355 is −12 V−(−12 V)=0 V.

A bias condition of the discharging part 355 may be held to about 0 V to prevent damage to the discharging part 355 from a high temperature. When first to fourth holding parts 381, 382, 383 and 384 are damaged by a long driving duration, the gate/source voltage VGS of the pull-up part 330 may be held negative by the discharging part 255. Thus, a gate driving circuit driving margin may be obtained at a high temperature.

The switching part 370 includes a capacitor Cs and a twelfth TFT TFT12. The twelfth TFT TFT12 is turned on during the (m−1)-th and the m-th periods Tm−1 and Tm of the frame during which a high voltage is applied to the first output control part (Q node) and the switching part 370 discharges a voltage applied to the second output control part (N node) to the second low voltage VSS2. The twelfth TFT TFT12 is turned off during a remaining period of the frame excluding the m-th period Tm during which a low voltage is applied to the first output control part (Q node) and the switching part 370 applies to the second output control part (N node) the m-th N node signal CKNm, which has substantially the same phase as the first clock signal CK. A high voltage Vdd of the m-th N node signal CKNm is lower than a high voltage VDD of the first clock signal CK by a voltage difference of the capacitor Cs The first holding part 381 holds a voltage of the first output control part (Q node) as the second low voltage VSS2 in response to the m-th N node signal CKNm for a remaining period of the frame excluding the m-th period Tm. The second holding part 382 holds a voltage of the third output control node (O node) as the first low voltage VSS1 in response to the m-th N node signal CKNm during a remaining period of the frame excluding the m-th period Tm.

The third holding part 383 holds a voltage of the first output control part (Q node) as the second low voltage VSS2 in response to the (m−1)-th N node signal CKNm−1 during a remaining period of the frame excluding the m-th period Tm. The fourth holding part 384 a voltage of the third output control part (O node) as the first low voltage VSS1 in response to the (m−1)-th N node signal CKNm−1 during a remaining period of the frame excluding the m-th period Tm.

The compensation charging part 390 includes a capacitor Cc having a first electrode connected to the second clock terminal CT2 and a second electrode connected to the first output control part (Q node). The second clock terminal CT2 receives the (m−1)-th N node signal CKNm−1. The compensation charging part 390 increases a discharge time during which a voltage of the first output control part (Q node) is discharged to the second low voltage VSS2.

The bootstrapped voltage VBT applied to the first output control part (Q node) is discharged to the second low voltage VSS2 via the first holding part 381. The first holding part 381 increases the discharge time using a voltage charged in the compensation charging part 390. The compensation charging part 290 increases a driving time of the first holding part 381 during which the voltage of the first output control part (Q node) is discharged to the second low voltage VSS2 via first holding part 281, to improve a bump of the m-th gate signal Gm resulting from the coupling between the (m+1)-th and the m-th gate signal Gm+1 and Gm.

The phase of the (m−1)-th N node signal CKNm−1 of the capacitor Cc of the compensation charging part 390 is opposite to the phase of a Q node signal Qm of the first output control part (Q node). When the Q node signal Qm is pulled down, the (m−1)-th N node signal CKNm−1 pulls up. Thus, the discharge time of the first output control part (Q node) may be increased. In addition, the (m−1)-th node signal CKNm−1 has the low voltage during the m-th period Tm−1 during which the first output control part (Q node) is precharged by the charging part 210, so that the first output control part (Q node) may be easily pre-charged.

According to embodiments of the present invention, a negative voltage is applied between a control part and an input part of a pull-up part. An output current of the pull-up part decreases to prevent gate driving circuit noise due to high temperatures. A control signal level controlling a holding part that holds a low level of a gate signal decreases to prevent damage to the holding part resulting from long driving durations.

In addition, a discharging part is controlled by using a carry signal of a next stage to prevent damage due to long driving durations. In addition, a discharging time of a first output control part (Q node) increases by using a compensation charging part, to improve a bump caused by a gate signal of the next stage.

The foregoing is illustrative of the present invention and is not to be construed as limiting thereof. Although a few exemplary embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. A gate driving circuit including a plurality of stages cascade-connected to each other, each of the plurality of stages outputting a plurality of gate signals, an m-th stage of the stages comprising:
a pull-up part for outputting a high voltage of a clock signal as a high voltage of an m-th gate signal in response to a high voltage received from a first output control part;
a pull-down part for pulling down the high voltage of the m-th gate signal to a first low voltage in response to a high voltage of an (m+1)-th gate signal;
a first holding part for holding a voltage received from the first output control part as a second low voltage having a level lower than the first low voltage in response to the high voltage of the clock signal; and
a second holding part for holding a low voltage of the m-th gate signal to the first low voltage in response to the high voltage of the clock signal.

2. The gate driving circuit of claim 1, further comprising:
a carry part including a control part connected to the first output control part, an input part connected to a first clock terminal that receives the clock signal, and an output part connected to the first output control part through a capacitor; and
a discharging part including a control part connected to a second input terminal that receives the gate signal of an (m+1)-th stage, an input part connected to the first output control part, and an output part connected to a first voltage terminal that receives the first low voltage.

3. The gate driving circuit of claim 1, further comprising:
a carry part including a control part connected to the first output control part, an input part connected to a first clock terminal that receives the clock signal, and an output part connected to the first output control part through a capacitor; and
a discharging part including a control part connected to a third input terminal that receives a carry signal of an (m+1)-th stage, an input part connected to the first output control part, and an output part connected to a second voltage terminal that receives the second low voltage.

4. The gate driving circuit of claim 1, further comprising:
a switching part for discharging a signal received from a second output control part to the second low voltage during an m-th period in which the m-th stage outputs the high voltage of the m-th gate signal, and for applying a signal synchronized with the clock signal to the second output control part during a period except for the m-th period of a frame,
wherein the first and second holding parts are connected to the second output control part.

5. The gate driving circuit of claim 4, further comprising:
a compensation charging part including a capacitor having first and second electrodes, the first electrode being connected to a second clock terminal that receives a signal applied to a second output control part of an (m−1)-th stage, the second electrode being connected to the first output control part.

6. The gate driving circuit of claim 5, wherein the pull-up part includes a control part connected to the first output control part, an input part connected to a first clock terminal that receives the clock signal, and an output part connected to a third output control part to which a signal corresponding to the m-th gate signal is applied,
the pull-down part includes a control part connected to a second input terminal that receives the (m+1)-th gate signal, an input part connected to the third output control part, and an output part connected to a first voltage terminal receiving the first low voltage,
the first holding part includes a control part connected to the second output control part, an input part connected to the first output control part, and an output part connected to a second voltage terminal that receives the second low voltage, and
the second holding part includes a control part connected to the second output control part, an input part connected to the third output control part, and an output part connected to the first voltage terminal.

7. The gate driving circuit of claim 6, further comprising:
a third holding part including a control part connected to the second clock terminal, an input part connected to the first output control part, and an output part connected to the second voltage terminal, and
a fourth holding part including a control part connected to the second clock terminal, an input part connected to the third output control part, and an output part connected to the first voltage terminal.

8. The gate driving circuit of claim 7, further comprising:
a buffer part including a control part and an input part connected to a first input terminal that receives an (m−1)-th carry signal, and an output part connected to the first output control part; and
a charging part including a first part connected to the first output control part and a second part connected to the third output control part.

9. The gate driving circuit of claim 6, wherein the switching part includes a first transistor connected to the first clock terminal and turned on in response to the high voltage of the clock signal, and a second transistor connected to the first output control part and turned on in response to a high voltage applied to the first output control part.

10. The gate driving circuit of claim 6, wherein the switching part includes a capacitor including a first electrode connected to the first clock terminal and a second electrode connected to the second output control part, and a transistor including a control part connected to the first output control part, an input part connected to the second output control part, and an output part connected to the second voltage terminal.

11. A display device comprising:
a display panel including a display area displaying an image, the display area including gate lines and source lines, and a peripheral area surrounding the display area;

a source driving circuit outputting data signals to the source lines; and a gate driving circuit integrated in the peripheral area and including a plurality of stages outputting gate signals to the gate lines, an m-th stage of the plurality of stages comprising:

a pull-up part for outputting a high voltage of a clock signal as a high voltage of an m-th gate signal in response to a high voltage received from a first output control part;

a pull-down part for pulling down the high voltage of the m-th gate signal to a first low voltage in response to a high voltage of an (m+1)-th gate signal;

a first holding part for holding a voltage received from the first output control part as a second low voltage having a level lower than the first low voltage in response to the high voltage of the clock signal; and a second holding part for holding a low voltage of the m-th gate signal to the first low voltage in response to the high voltage of the clock signal.

12. The display device of claim 11, further comprising:
a carry part including a control part connected to the first output control part, an input part connected to a first clock terminal that receives the clock signal, and an output part connected to the first output control part through a capacitor; and
a discharging part including a control part connected to a second input terminal that receives the gate signal of an (m+1)-th stage, an input part connected to the first output control part, and an output part connected to a first voltage terminal that receives the first low voltage.

13. The display device of claim 11, further comprising:
a carry part including a control part connected to the first output control part, an input part connected to a first clock terminal that receives the clock signal, and an output part connected to the first output control part through a capacitor; and
a discharging part including a control part connected to a third input terminal that receives a carry signal of an (m+1)-th stage, an input part connected to the first output control part, and an output part connected to a second voltage terminal that receives the second low voltage.

14. The display device of claim 11, further comprising:
a switching part for discharging a signal received from a second output control part to the second low voltage during an m-th period in which the m-th stage outputs the high voltage of the m-th gate signal, and for applying a signal synchronized with the clock signal to the second output control part during a period except for the m-th period of a frame,
wherein the first and second holding parts are connected to the second output control part.

15. The display device of claim 14, further comprising:
a compensation charging part including a capacitor having first and second electrodes, the first electrode being connected to a second clock terminal that receives a signal applied to a second output control part of an (m−1)-th stage, the second electrode being connected to the first output control part.

16. The display device of claim 15, wherein the pull-up part includes a control part connected to the first output control part, an input part connected to a first clock terminal that receives the clock signal, and an output part connected to a third output control part to which a signal corresponding to the m-th gate signal is applied,
the pull-down part includes a control part connected to a second input terminal that receives the (m+1)-th gate signal, an input part connected to the third output control part, and an output part connected to a first voltage terminal receiving the first low voltage,
the first holding part includes a control part connected to the second output control part, an input part connected to the first output control part, and an output part connected to a second voltage terminal that receives the second low voltage, and
the second holding part includes a control part connected to the second output control part, an input part connected to the third output control part, and an output part connected to the first voltage terminal.

17. The display device of claim 16, further comprising:
a third holding part including a control part connected to the second clock terminal, an input part connected to the first output control part, and an output part connected to the second voltage terminal, and
a fourth holding part including a control part connected to the second clock terminal, an input part connected to the third output control part, and an output part connected to the first voltage terminal.

18. The display device of claim 17, further comprising:
a buffer part including a control part and an input part connected to a first input terminal that receives an (m−1)-th carry signal, and an output part connected to the first output control part; and
a charging part including a first part connected to the first output control part and a second part connected to the third output control part.

19. The display device of claim 16, wherein the switching part includes a first transistor connected to the first clock terminal and turned on in response to the high voltage of the clock signal, and a second transistor connected to the first output control part and turned on in response to a high voltage applied to the first output control part.

20. The display device of claim 16, wherein the switching part includes a capacitor including a first electrode connected to the first clock terminal and a second electrode connected to the second output control part, and a transistor including a control part connected to the first output control part, an input part connected to the second output control part, and an output part connected to the second voltage terminal.

* * * * *